(12) United States Patent
Takata et al.

(10) Patent No.: US 7,905,733 B2
(45) Date of Patent: Mar. 15, 2011

(54) POWER BOARD, ON-BOARD CONNECTOR, LIGHTING DEVICE, DISPLAY DEVICE AND TELEVISION RECEIVER

(75) Inventors: Yoshiki Takata, Suzuka (JP); Kenichi Iwamoto, Kobe (JP); Takaaki Kudo, Shibuya-ku (JP); Naofumi Ikenaga, Shibuya-ku (JP)

(73) Assignees: Sharp Kabushiki Kaisha, Osaka (JP); Japan Aviation Electronics Industry, Limited, Tokyo (JP)

( * ) Notice: Subject to any disclaimer, the term of this patent is extended or adjusted under 35 U.S.C. 154(b) by 19 days.

(21) Appl. No.: 12/305,378

(22) PCT Filed: May 24, 2007

(86) PCT No.: PCT/JP2007/060633
§ 371 (c)(1),
(2), (4) Date: Dec. 18, 2008

(87) PCT Pub. No.: WO2008/001567
PCT Pub. Date: Jan. 3, 2008

(65) Prior Publication Data
US 2009/0280698 A1 Nov. 12, 2009

(30) Foreign Application Priority Data

Jun. 30, 2006 (JP) .................................. 2006-181506
Jan. 31, 2007 (JP) .................................. 2007-021213

(51) Int. Cl.
*H01R 13/44* (2006.01)
(52) U.S. Cl. ........................................ 439/150; 362/97.1

(58) Field of Classification Search .................. 439/750, 439/500, 568; 362/97.1, 97.2, 217.01, 217.02; 349/58
See application file for complete search history.

(56) References Cited

U.S. PATENT DOCUMENTS

| | | | | |
|---|---|---|---|---|
| 3,951,494 A | * | 4/1976 | Romine | 439/81 |
| 4,634,200 A | * | 1/1987 | Dechelette | 439/75 |
| 4,684,200 A | * | 8/1987 | Capp | 439/387 |
| 5,702,271 A | * | 12/1997 | Steinman | 439/676 |

FOREIGN PATENT DOCUMENTS

CN 1581595 A 2/2005

(Continued)

OTHER PUBLICATIONS

Official Communication issued in International Patent Application No. PCT/JP2007/060633, mailed on Jun. 26, 2007.

(Continued)

*Primary Examiner* — T C Patel
*Assistant Examiner* — Phuongchi T Nguyen
(74) *Attorney, Agent, or Firm* — Keating & Bennett, LLP

(57) ABSTRACT

A power board includes an on-board connector having an output terminal that is surrounded by a housing made of synthetic resin. The output terminal is arranged in an area of the housing that is farther from the edge portion of a circuit board so that sectional arrangement is provided. The output terminal is thus surrounded by the synthetic-resin housing, and thereby a leak at the output terminal can be prevented. Further, the output terminal is arranged in the limited area of the housing farther from the edge portion of the circuit board, resulting in a long distance maintained between the output terminal and the edge portion of the circuit board, which can effectively prevent the leak.

4 Claims, 39 Drawing Sheets

FOREIGN PATENT DOCUMENTS

| | | |
|---|---|---|
| JP | 2002-367422 A | 12/2002 |
| JP | 2003-282170 A | 10/2003 |
| JP | 2004-294592 A | 10/2004 |
| JP | 2005-050745 A | 2/2005 |
| KR | 10-2005-0014730 A | 2/2005 |
| SU | 1321379 A3 | 6/1987 |

OTHER PUBLICATIONS

Takata et al.; "Discharge Tube, Ferrule, Lighting Device, Display Device and Television Receiver"; U.S. Appl. No. 12/305,371, filed Dec. 18, 2008.

Takata et al.; "Backlight Module, Backlight Module Manufacturing Method, Lighting Device, Display Device and Television Receiver"; U.S. Appl. No. 12/305,372, filed Dec. 18, 2008.

Takata et al.; "Relay Connector, Mounting Structure of Relay Connector and Chassis, and Mounting Structure of Relay Connector and Discharge Tube"; U.S. Appl. No. 12/305,373, filed Dec. 18, 2008.

Takata et al.; "Discharge Tube, Ferrule, Lighting Device, Display Device and Television Receiver"; U.S. Appl. No. 12/305,374, filed Dec. 18, 2008.

Takata et al.; "Power Board, On-Board Connector, Lighting Device, Display Device and Television Receiver"; U.S. Appl. No. 12/305,377, filed Dec. 18, 2008.

Takata et al.: "Discharge Tube, Ferrule, Lighting Device, Display Device and Television Receiver," U.S. Appl. No. 12/358,303, filed Jan. 23, 2009.

Takata et al., "Discharge Tube, Ferrule, Lighting Device, Display Device and Television Receiver," U.S. Appl. No. 12/642,194, filed Dec. 18, 2009.

Takata et al., "Discharge Tube, Ferrule, Lighting Device, Display Device and Television Receiver," U.S. Appl. No. 12/642,043, filed Dec. 18, 2009.

Takata et al., "Relay Connector, Mounting Structure of Relay Connector and Chassis, and Mounting Structure of Relay Connector and Discharge Tube," U.S. Appl. No. 12/642,297, filed Dec. 18, 2009.

Takata et al., "Discharge Tube, Ferrule, Lighting Device, Display Device and Television Receiver," U.S. Appl. No. 12/645,738, filed Dec. 23, 2009.

Takata et al., "Discharge Tube, Ferrule, Lighting Device, Display Device and Television Receiver," U.S. Appl. No. 12/768,896, filed Apr. 28, 2010.

Takata et al., "Relay Connector, Mounting Structure of Relay Connector and Chassis, and Mounting Structure of Relay Connector and Discharge Tube," U.S. Appl. No. 12/768,932, filed Apr. 28, 2010.

* cited by examiner

POWER BOARD, ON-BOARD CONNECTOR, LIGHTING DEVICE, DISPLAY DEVICE AND TELEVISION RECEIVER

BACKGROUND OF THE INVENTION

1. Field of the Invention

The present invention relates to a power board, an on-board connector, a lighting device, a display device and a television receiver.

2. Description of the Related Art

An example of a lighting device capable of functioning as a backlight for a liquid crystal display device is disclosed in JP-A-2004-294592. The lighting device has a structure in which the end portions of a plurality of elongated discharge tubes are fixed to respective relay terminals mounted to a substantially flat plate-shaped chassis. The output terminals of power boards are also connected to the respective relay terminals, so that the discharge tubes can receive the power supply from the power boards via the relay terminals.

The relay terminals are arranged in the vicinity of a lateral edge portion of the chassis, and therefore the output terminals are also arranged in the vicinity of the lateral edge portion of the chassis. On the other hand, the power boards are arranged to overlap with the chassis. Consequently, the output terminal should be arranged in the vicinity of the edge portion of the circuit board of the power board.

A high voltage is applied to the output terminals. Therefore, a leak may occur between the output terminal and an electrical conductor approaching the edge portion of the circuit board.

SUMMARY OF THE INVENTION

In view of the foregoing circumstances, preferred embodiments of the present invention prevent a leak from occurring at an output terminal arranged in the vicinity of an edge portion of a circuit board.

A power board according to a preferred embodiment of the present invention includes a circuit board and an on-board connector provided on the circuit board. The on-board connector is arranged in the vicinity of an edge portion of the circuit board. The on-board connector includes an output terminal, and a housing that is made of an insulating material and is arranged to surround at least a portion of the output terminal. The output terminal is arranged in an area of the housing farther from the edge portion of the circuit board so that sectional arrangement is provided.

In this case, the output terminal is surrounded by the housing made of an insulating material. Thereby, a leak at the output terminal can be prevented, compared to a case where an output terminal is barely provided. Further, the output terminal is arranged in the limited area of the housing farther from the edge portion of the circuit board, resulting in a long distance maintained between the output terminal and the edge portion of the circuit board, which can effectively prevent the leak.

In the power board according to a preferred embodiment of the present invention described above, a portion of the housing, which is closer to the edge portion of the circuit board and is not involved in arrangement of the output terminal, may define a substantially block-shaped configuration provided continuously along the substantially entire width of the housing.

In this case, foreign substances can be reliably prevented from approaching the output terminal side from the edge portion of the circuit board, because the portion of the housing, which is arranged closer to the edge portion of the circuit board and does not include the output terminal, defines a substantially block-shaped configuration provided continuously along the substantially entire width of the housing.

Further, in the power board described above, a portion of the housing, which is closer to the edge portion of the circuit board and is not involved in arrangement of the output terminal, may define a reinforcing portion arranged to fix the housing to the circuit board.

In this case, the portion of the housing, which is arranged closer to the edge portion of the circuit board and does not include the output terminal, can effectively function as a reinforcing mechanism to fix the housing to the circuit board. The reinforcing portion can include a metallic or synthetic-resin terminal. For example, soldering, adhesive bonding or welding can be used as a reinforcing method, for example.

Further, in the power board described above, the output terminal preferably has an elongated shape arranged substantially perpendicularly to the edge portion of the circuit board, and can be positioned, in the width direction parallel or substantially parallel to the edge portion of the circuit board, so as to be at substantially the center of the housing.

In this case, foreign substances can be prevented from approaching the output terminal side from either lateral side of the housing, because the output terminal forms an elongated shape substantially perpendicular to the edge portion of the circuit board while being positioned at the across-the-width center of the housing.

Further, in the power board described above, a terminal holding portion of the housing, provided for arrangement of the output terminal, can be preferably larger than a portion of the housing not involved in arrangement of the output terminal, in thickness measured from the circuit board, so that a step-shaped structure is provided therebetween.

In this case, the terminal holding portion preferably has a large thickness, and therefore the shape and/or size of the output terminal held in the terminal holding portion can be set with increased flexibility.

Further, in the power board described above, an edge portion of the terminal holding portion on the side of the portion not involved in arrangement of the output terminal may be cut into a tapered shape.

In this case, the edge portion of the terminal holding portion on the side of the portion not involved in arrangement of the output terminal is cut into a tapered shape. Therefore, when a cover is attached to the on-board connector, the opening edge of the cover is prevented from catching on the housing.

Further, in the power board described above, an engaging recess having an opening on an outer surface of the housing may be formed in the housing, so that a connecting portion of the output terminal, provided for connection to the outside, can be arranged in the engaging recess.

The connecting portion of the output terminal, provided for connection to the outside, cannot be covered up with the housing, for functional reasons. However, in this case, the connecting portion is arranged in the engaging recess. Therefore, the connecting portion is less subject to a leak, compared to arranging a connecting portion on the outer surface of the housing. Further, foreign substances can be prevented from interference with the connecting portion.

On the other hand, an on-board connector according to another preferred embodiment of the present invention is provided, which is to be mounted on a circuit board in order to provide a power board so as to be arranged in the vicinity of an edge portion of the circuit board. The on-board connector includes an output terminal, and a housing that is made of an insulating material and is arranged to surround at least a portion of the output terminal. The output terminal is arranged in an area of the housing, which is capable of being arranged farther from the edge portion of the circuit board, so that sectional arrangement is provided.

In this case, the output terminal is surrounded by the housing made of an insulating material. Thereby, a leak at the output terminal can be prevented, compared to a case where an output terminal is barely provided. Further, the output terminal is arranged in the limited area of the housing, which is capable of being arranged farther from the edge portion of the circuit board. This results in a long distance maintained between the output terminal and the edge portion of the circuit board, which can effectively prevent the leak.

In the on-board connector according to a preferred embodiment of the present invention described above, a portion of the housing, which is capable of being arranged closer to the edge portion of the circuit board and is not involved in arrangement of the output terminal, may form a substantially block-shaped configuration provided continuously along the substantially entire width of the housing.

In this case, foreign substances can be reliably prevented from approaching the output terminal side from the edge portion of the circuit board, because the portion of the housing, which is capable of being arranged closer to the edge portion of the circuit board and does not include the output terminal, defines a substantially block-shaped configuration provided continuously along the substantially entire width of the housing.

Further, in the on-board connector described above, a portion of the housing, which is capable of being arranged closer to the edge portion of the circuit board and is not involved in arrangement of the output terminal, may provide a reinforcing portion provided for fixing the housing to the circuit board.

In this case, the portion of the housing, which is capable of being arranged closer to the edge portion of the circuit board and does not include the output terminal, can effectively function as a reinforcing mechanism to fix the housing to the circuit board. The reinforcing portion can include a metallic or synthetic-resin terminal. For example, soldering, adhesive bonding or welding can be used as a reinforcing method, for example.

Further, in the on-board connector described above, the output terminal can have an elongated shape capable of being arranged substantially perpendicularly to the edge portion of the circuit board, and be positioned, in the width direction capable of being parallel or substantially parallel to the edge portion of the circuit board, so as to be at substantially the center of the housing.

In this case, foreign substances can be prevented from approaching the output terminal side from either lateral side of the housing, because the output terminal preferably has an elongated shape capable of being arranged substantially perpendicularly to the edge portion of the circuit board while being positioned at the across-the-width center of the housing.

Further, in the on-board connector described above, a terminal holding portion of the housing, provided for arrangement of the output terminal, can be larger than a portion of the housing not involved in arrangement of the output terminal, in thickness capable of being measured from the circuit board, so that a step-shaped structure is provided therebetween.

In this case, the terminal holding portion is preferably large in thickness, and therefore the shape and/or size of the output terminal held in the terminal holding portion can be set with increased flexibility.

Further, in the on-board connector described above, an edge portion of the terminal holding portion on the side of the portion not involved in arrangement of the output terminal may be cut into a tapered shape.

In this case, the edge portion of the terminal holding portion on the side of the portion not involved in arrangement of the output terminal is cut into a tapered shape. Therefore, when a cover is attached to the on-board connector, the opening edge of the cover is prevented from catching on the housing.

Further, in the on-board connector described above, an engaging recess having an opening on an outer surface of the housing may be formed in the housing, so that a connecting portion of the output terminal, provided for connection to the outside, can be arranged in the engaging recess.

The connecting portion of the output terminal, provided for connection to the outside, cannot be covered up with the housing, for functional reasons. However, in this case, the connecting portion is arranged in the engaging recess. Therefore, the connecting portion is less subject to a leak, compared to arranging a connecting portion on the outer surface of the housing. Further, foreign substances can be prevented from interference with the connecting portion.

A lighting device according to a preferred embodiment of the present invention includes the power board according to the above-described preferred embodiments of the present invention, a chassis in which the power board is arranged on the back side thereof, and a discharge tube arranged on the front side of the chassis so as to receive power supply from the power board.

A display device according to a preferred embodiment of the present invention includes the lighting device according to the above-described preferred embodiments of the present invention, and a display panel arranged on the front side of the lighting device.

A television receiver according to another further preferred embodiment of the present invention includes the display device according to the above-described preferred embodiment of the present invention.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Preferred Embodiment 1

Figure 1:
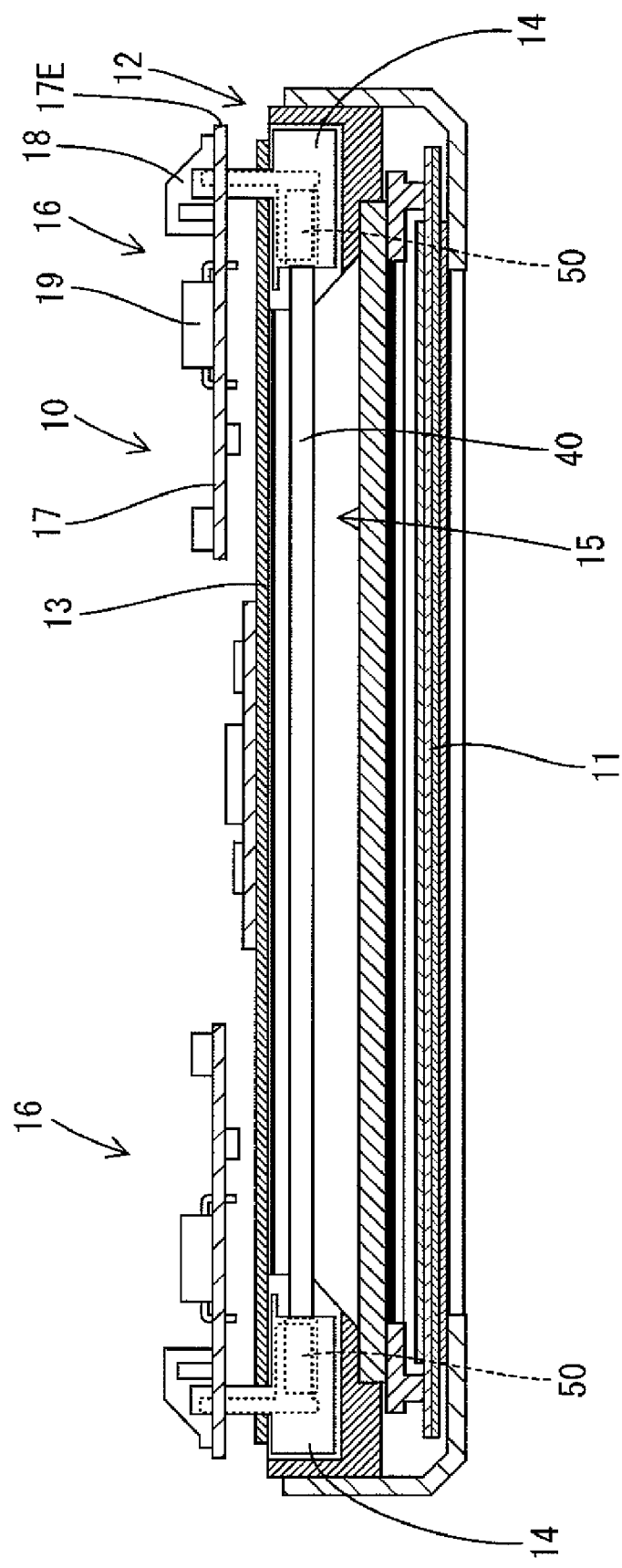
FIG. 1 is a horizontal sectional view of a display device according to preferred embodiment 1 of the present invention.
Figure 2:
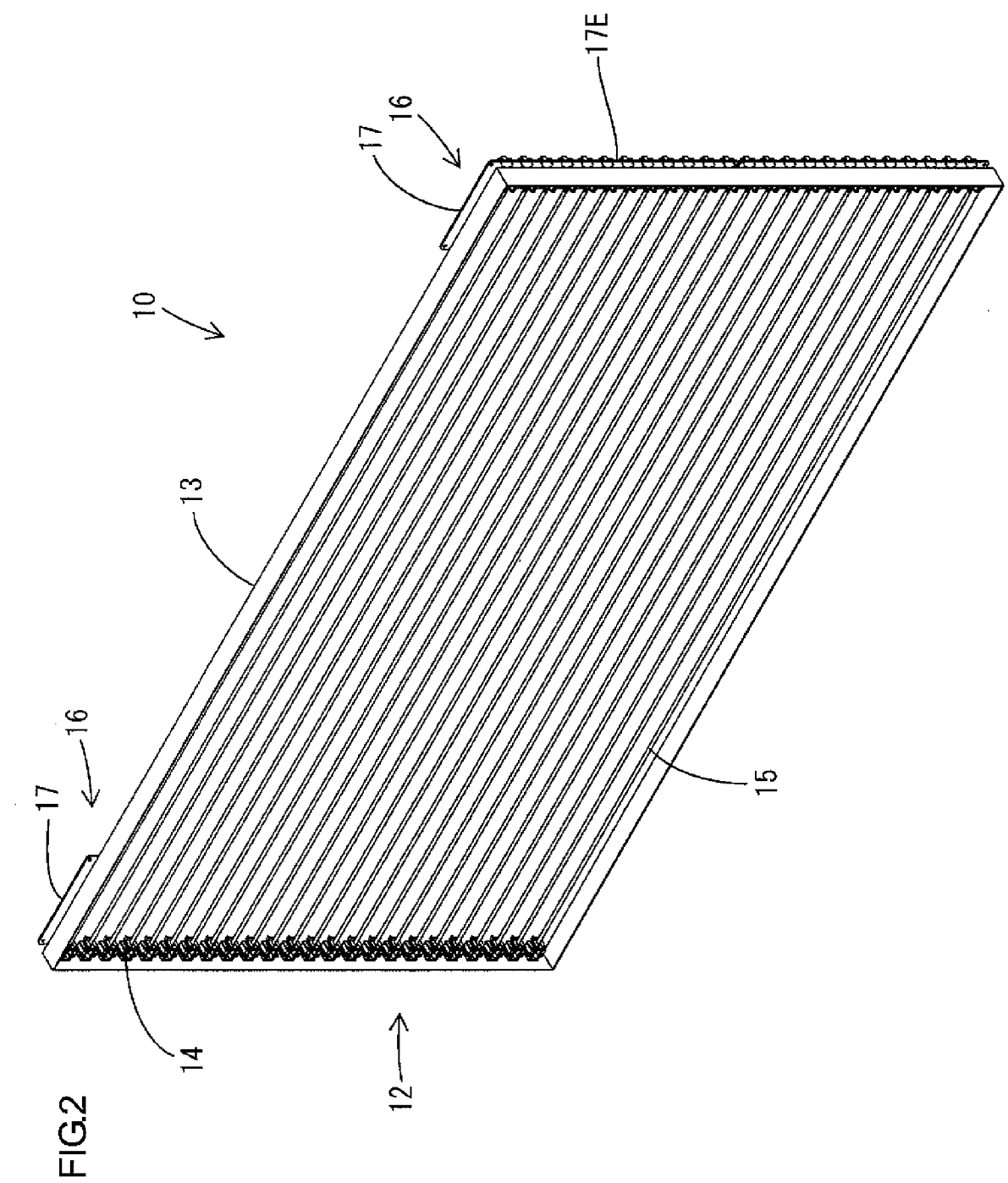
FIG. 2 is a perspective view of a lighting device.
Figure 3:
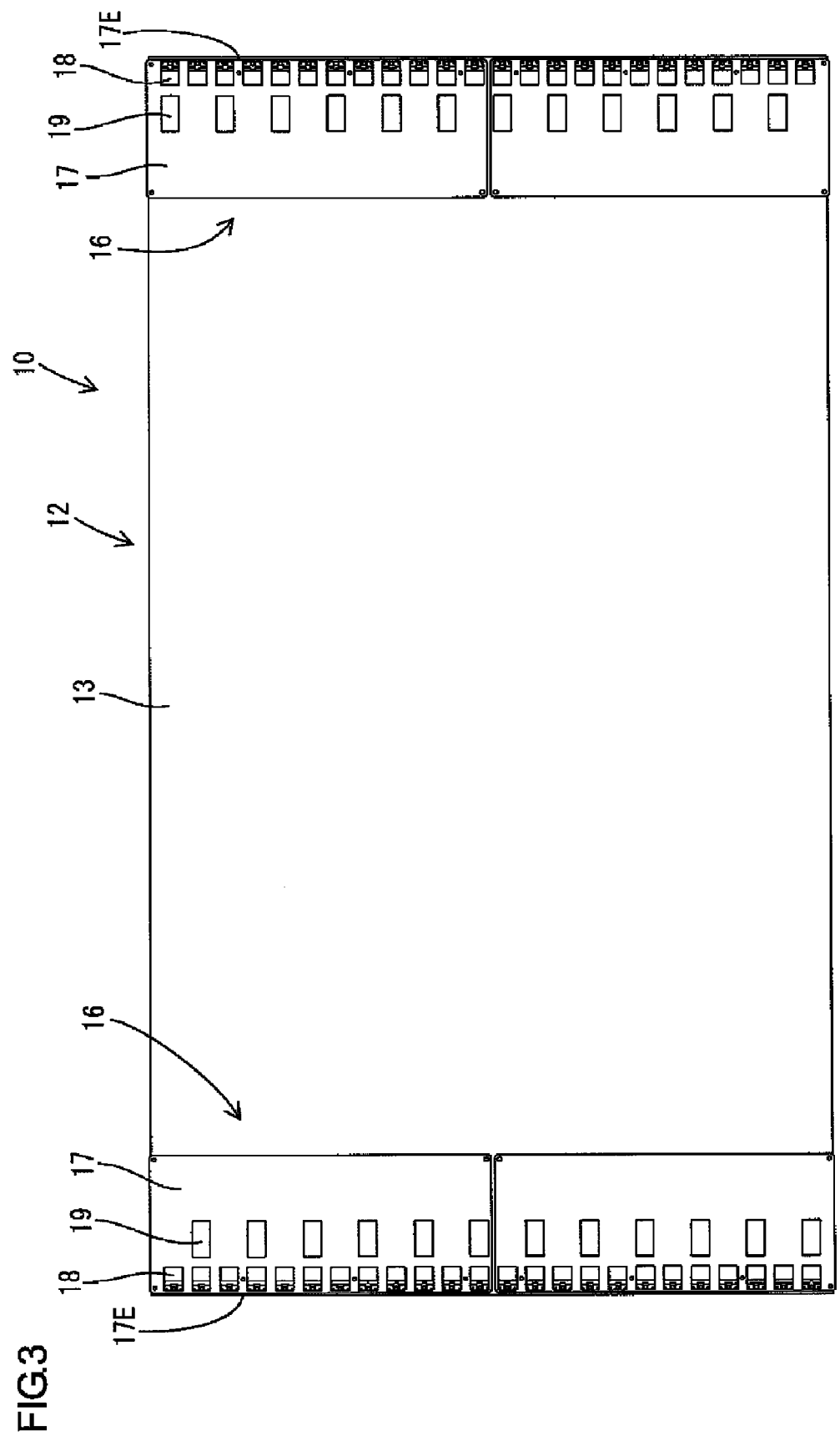
FIG. 3 is a rear view of the lighting device.
Figure 4:
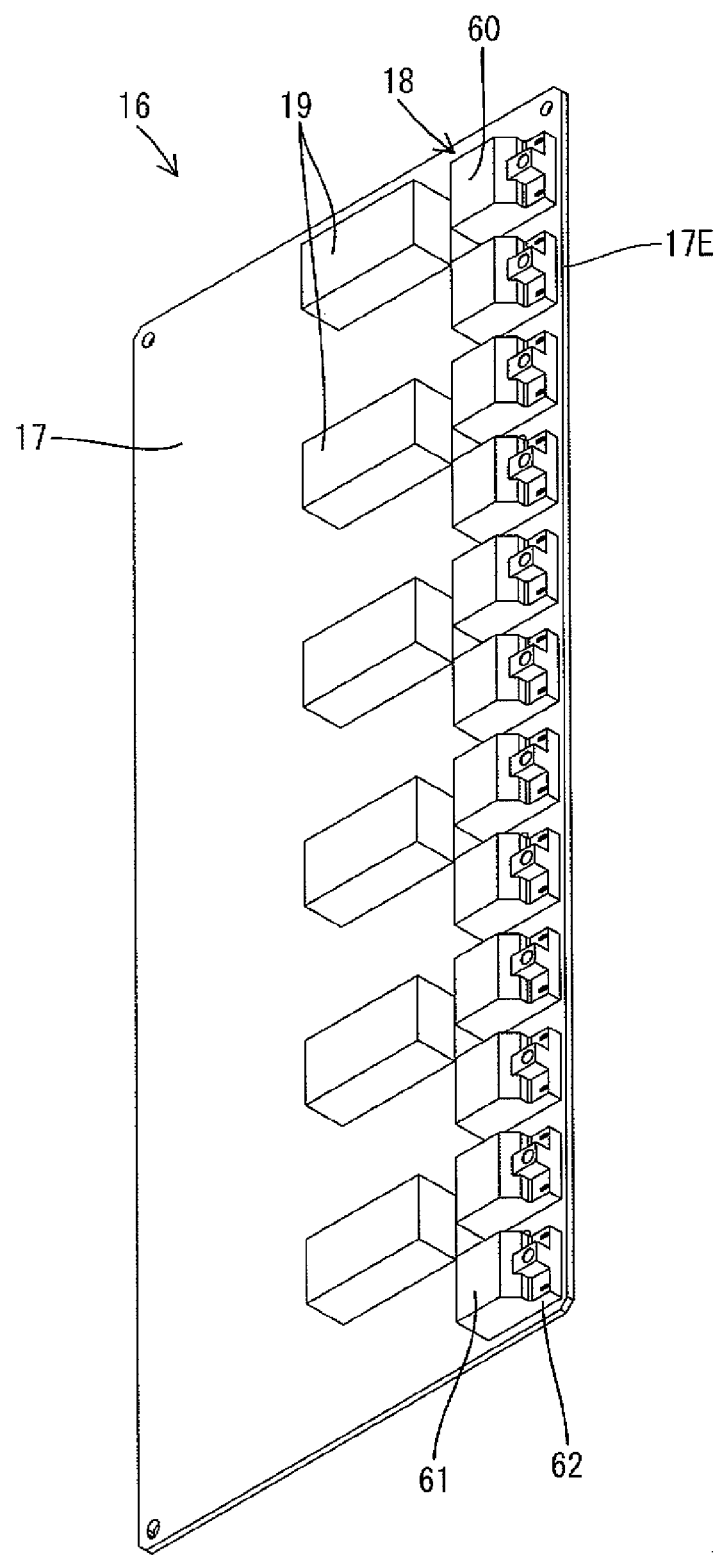
FIG. 4 is a perspective view of a power board.
Figure 5:
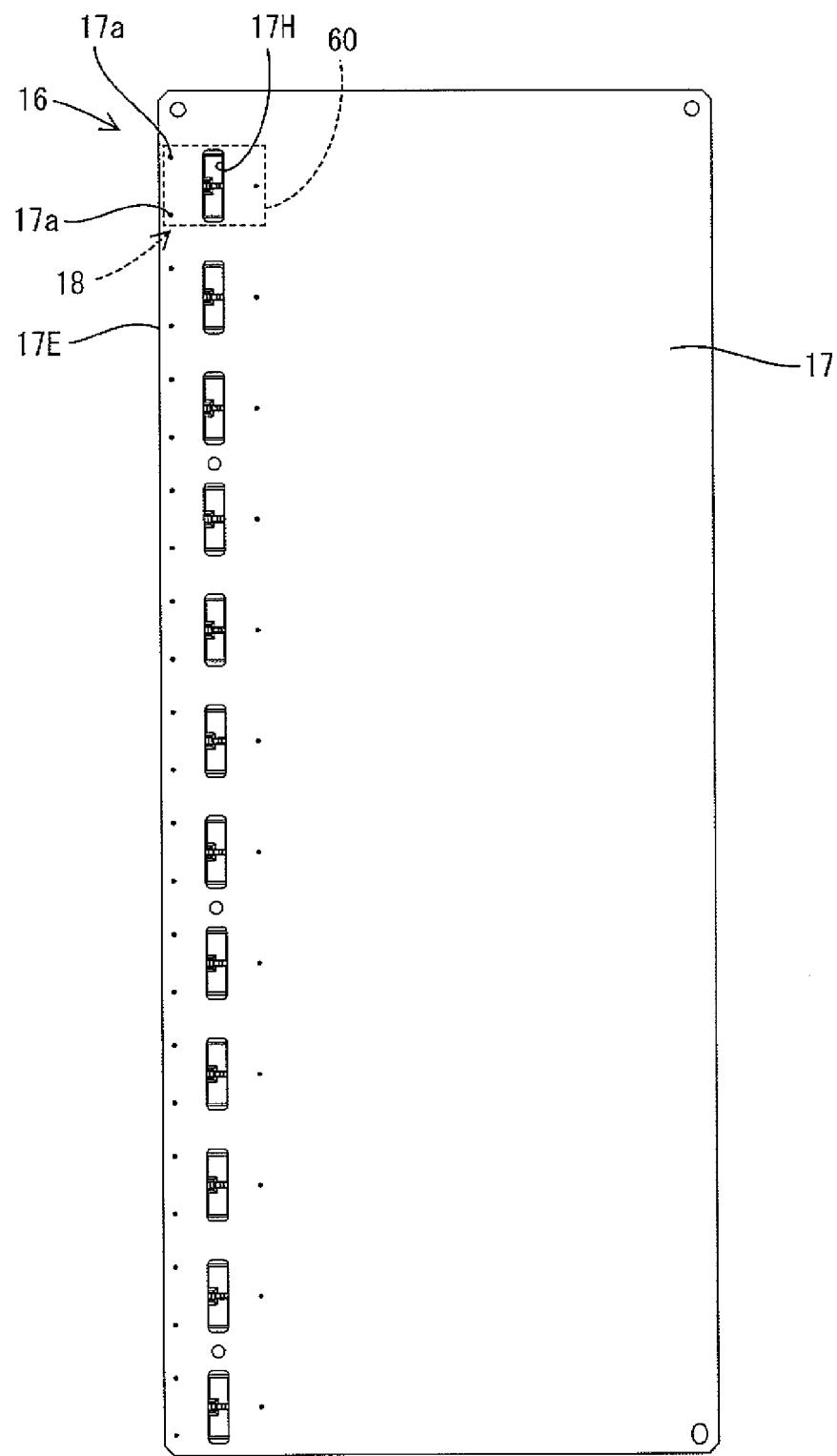
FIG. 5 is a front view of the power board.
Figure 6:
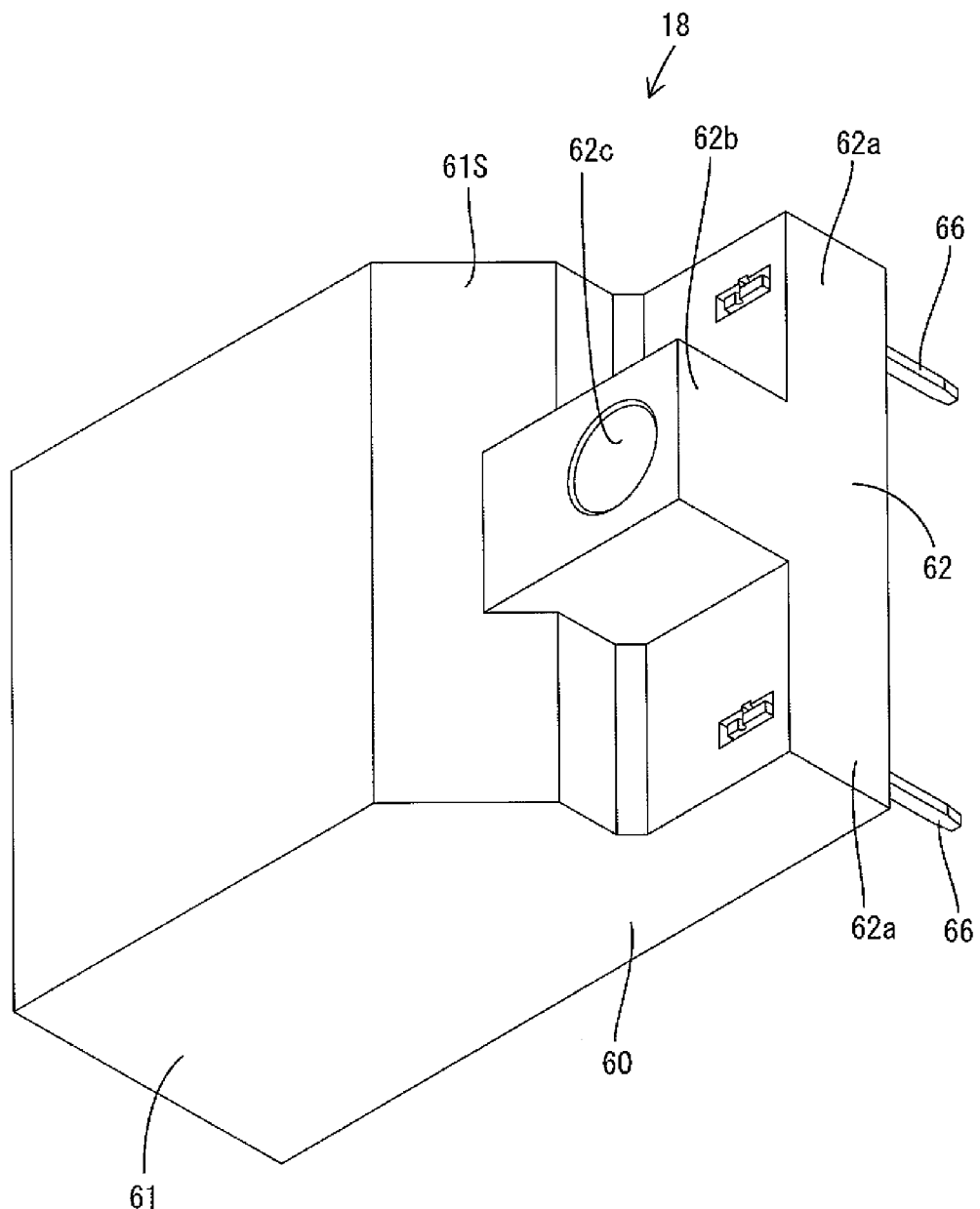
FIG. 6 is a perspective view of an on-board connector.
Figure 7:
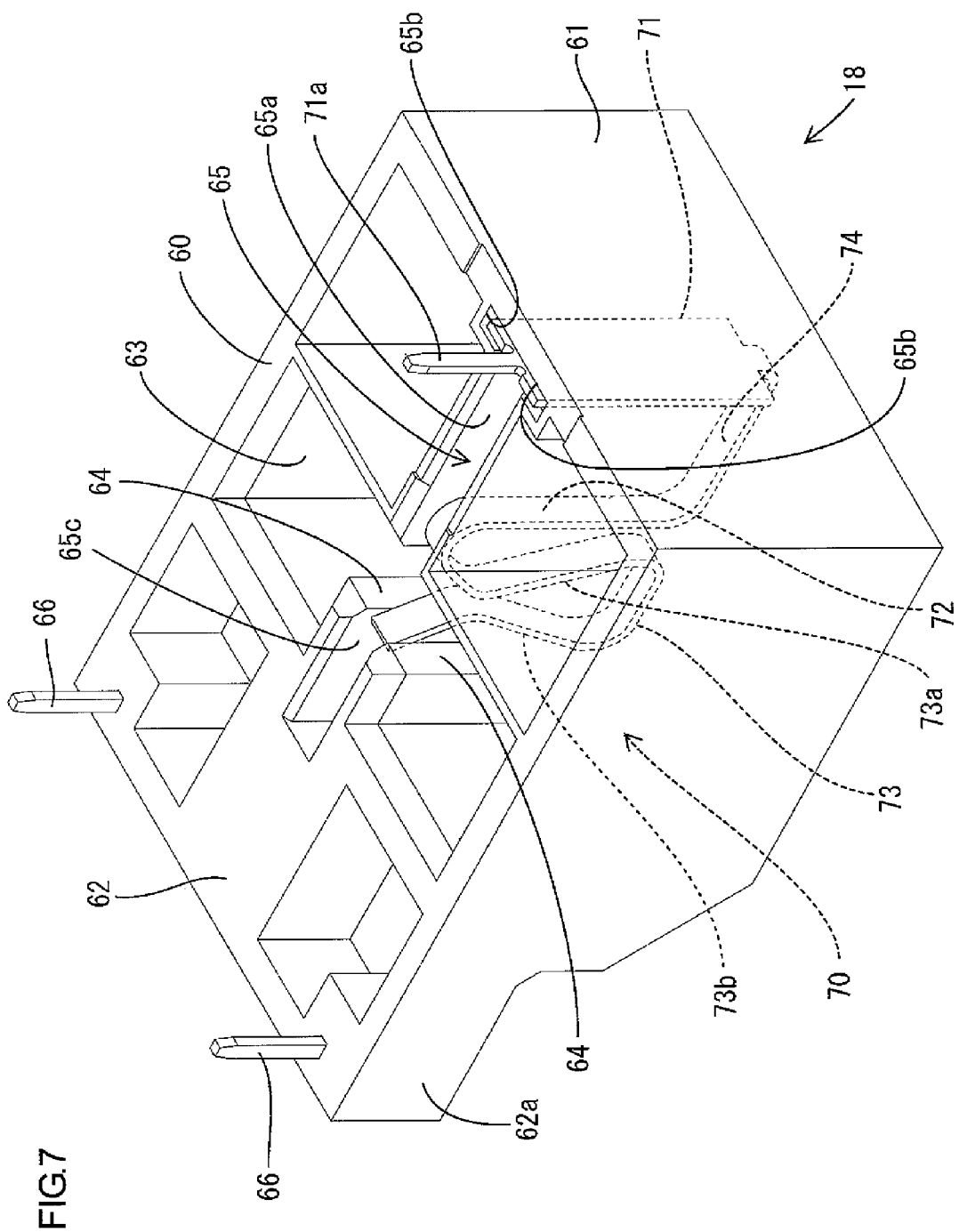
FIG. 7 is a perspective view of the on-board connector.
Figure 8:
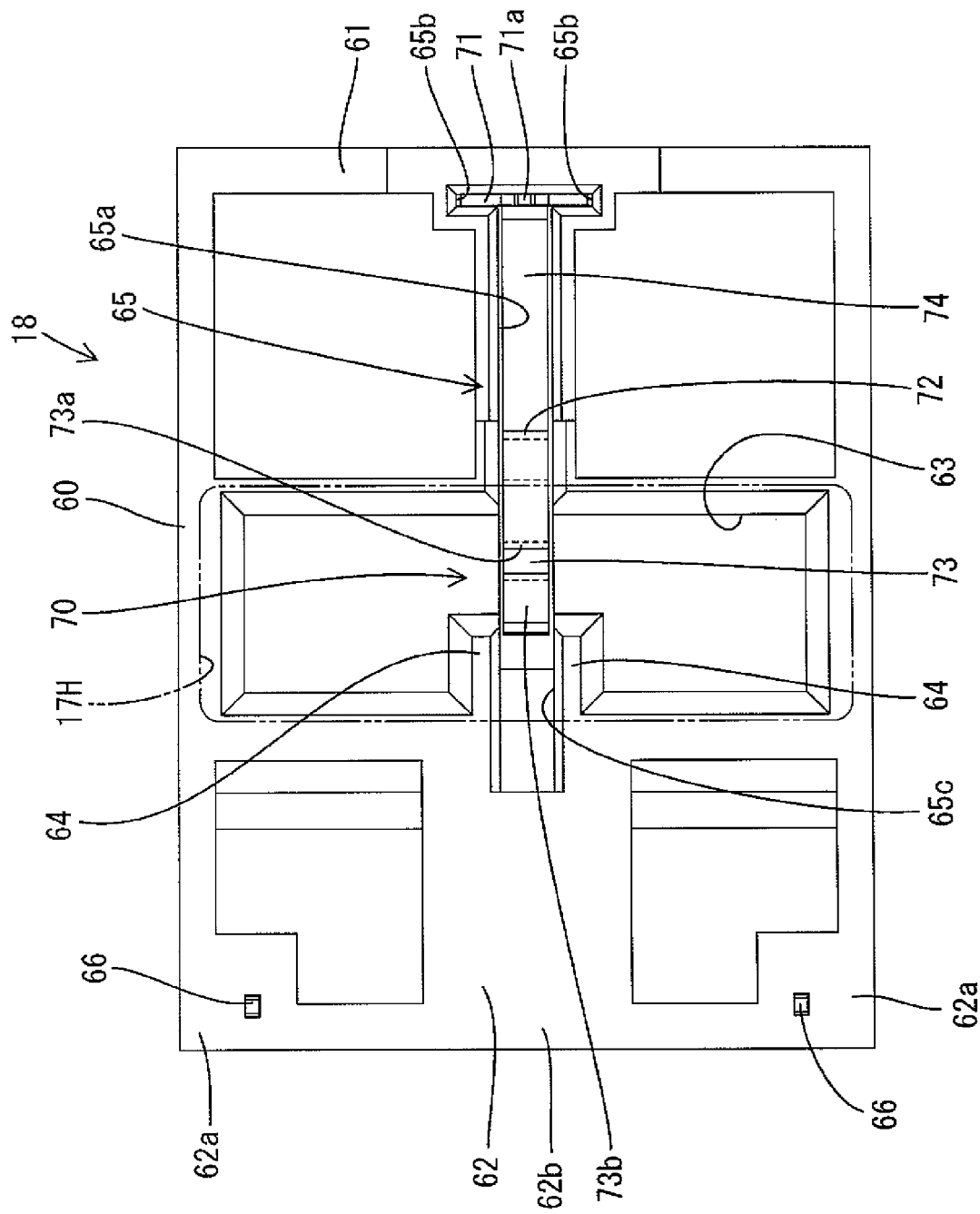
FIG. 8 is a front view of the on-board connector.
Figure 16:
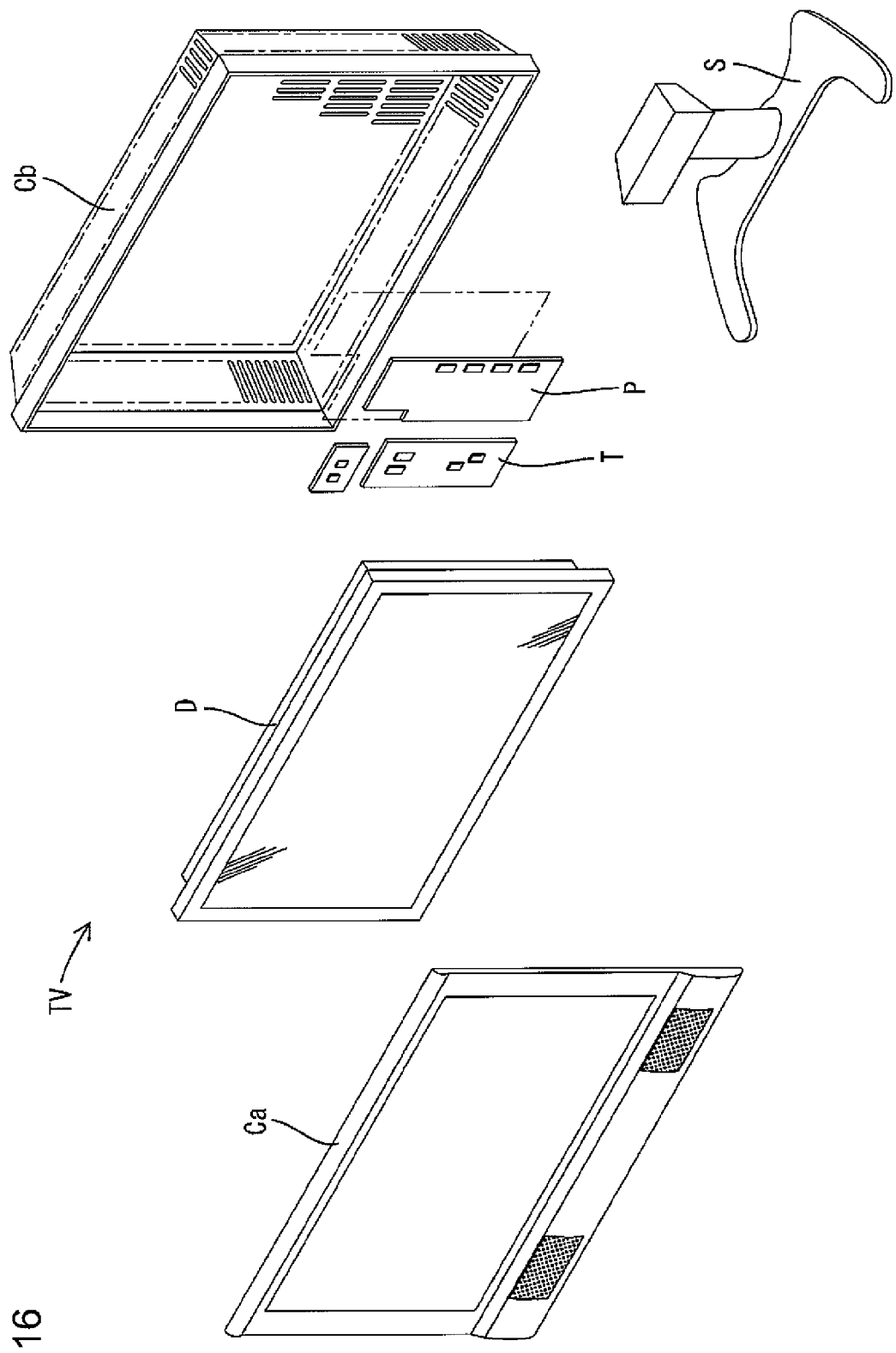
FIG. 16 is an exploded perspective view of a television receiver.
Figure 17:
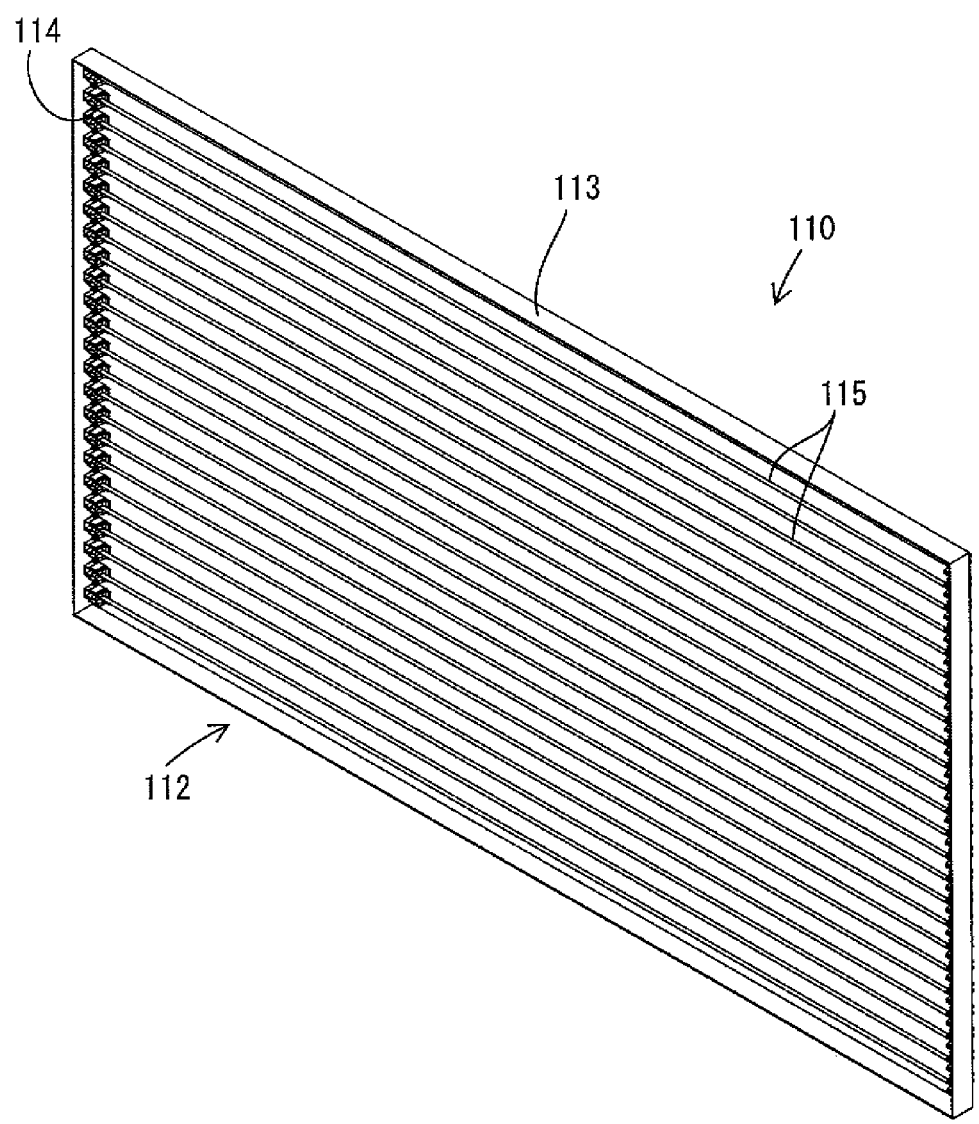
FIG. 17 is a front perspective view of a lighting device according to preferred embodiment 2 of the present invention.
Figure 18:
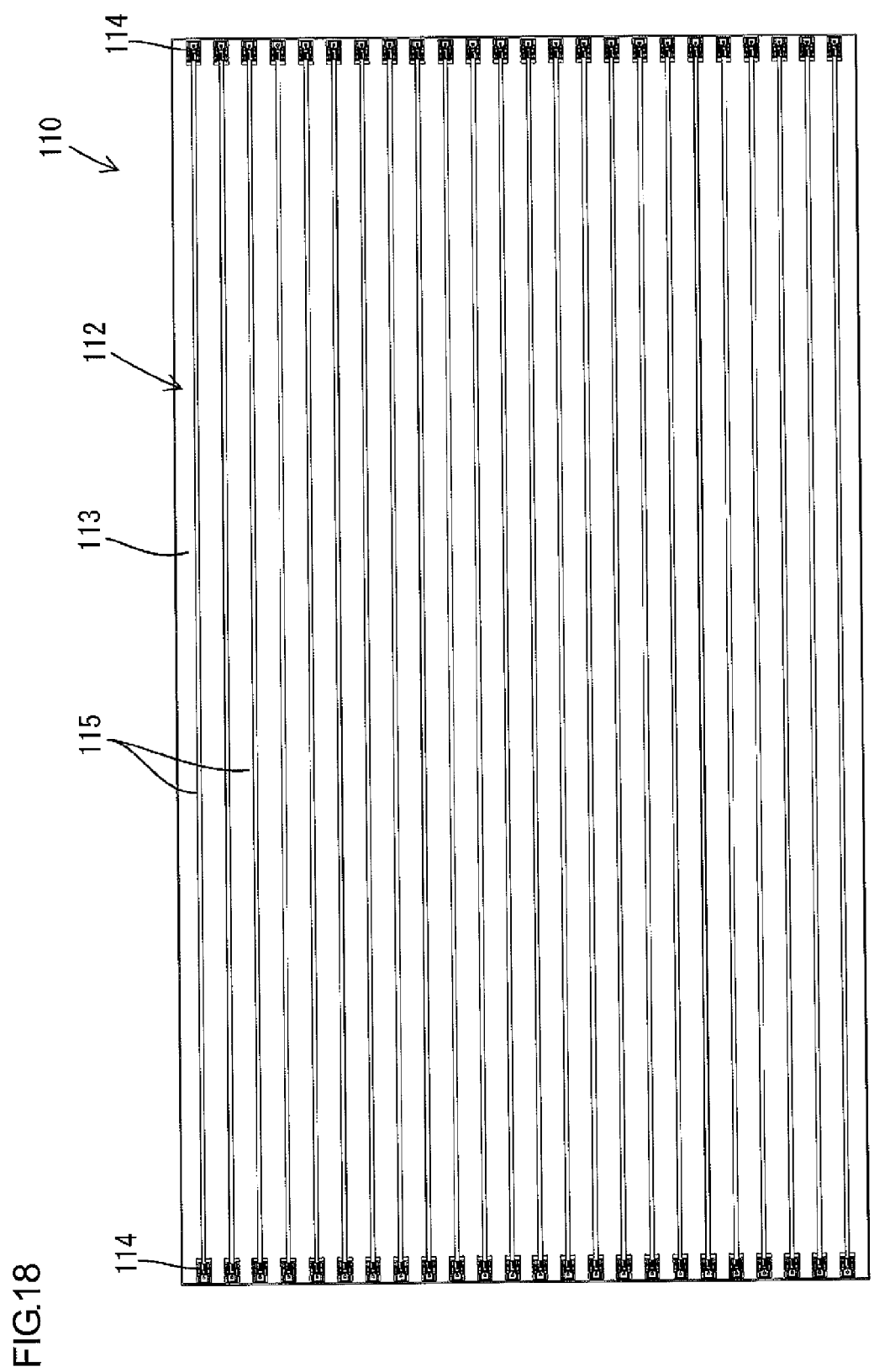
FIG. 18 is a front view of the lighting device.
Figure 19:
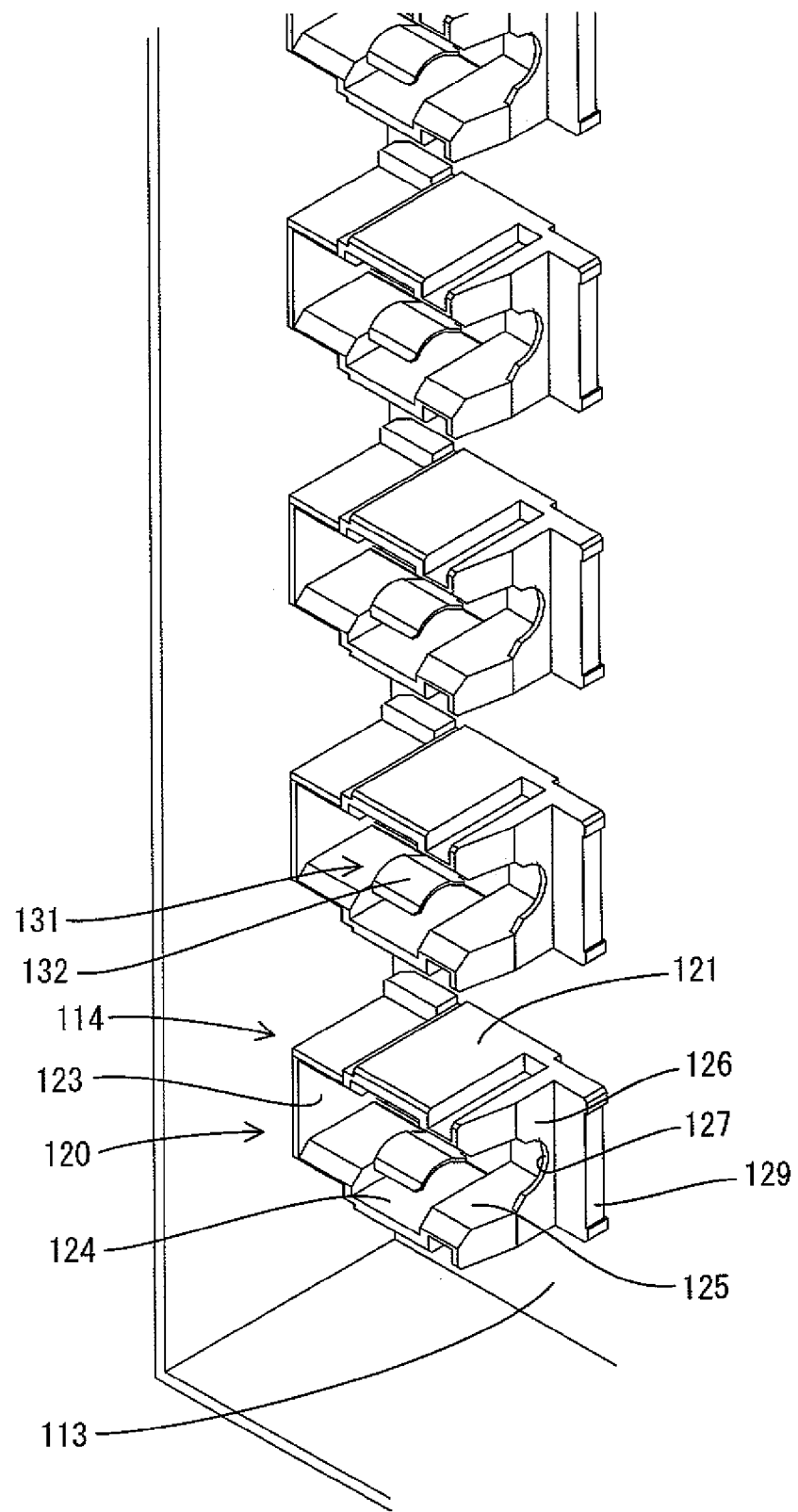
FIG. 19 is a perspective view of relay connectors.
Figure 20:
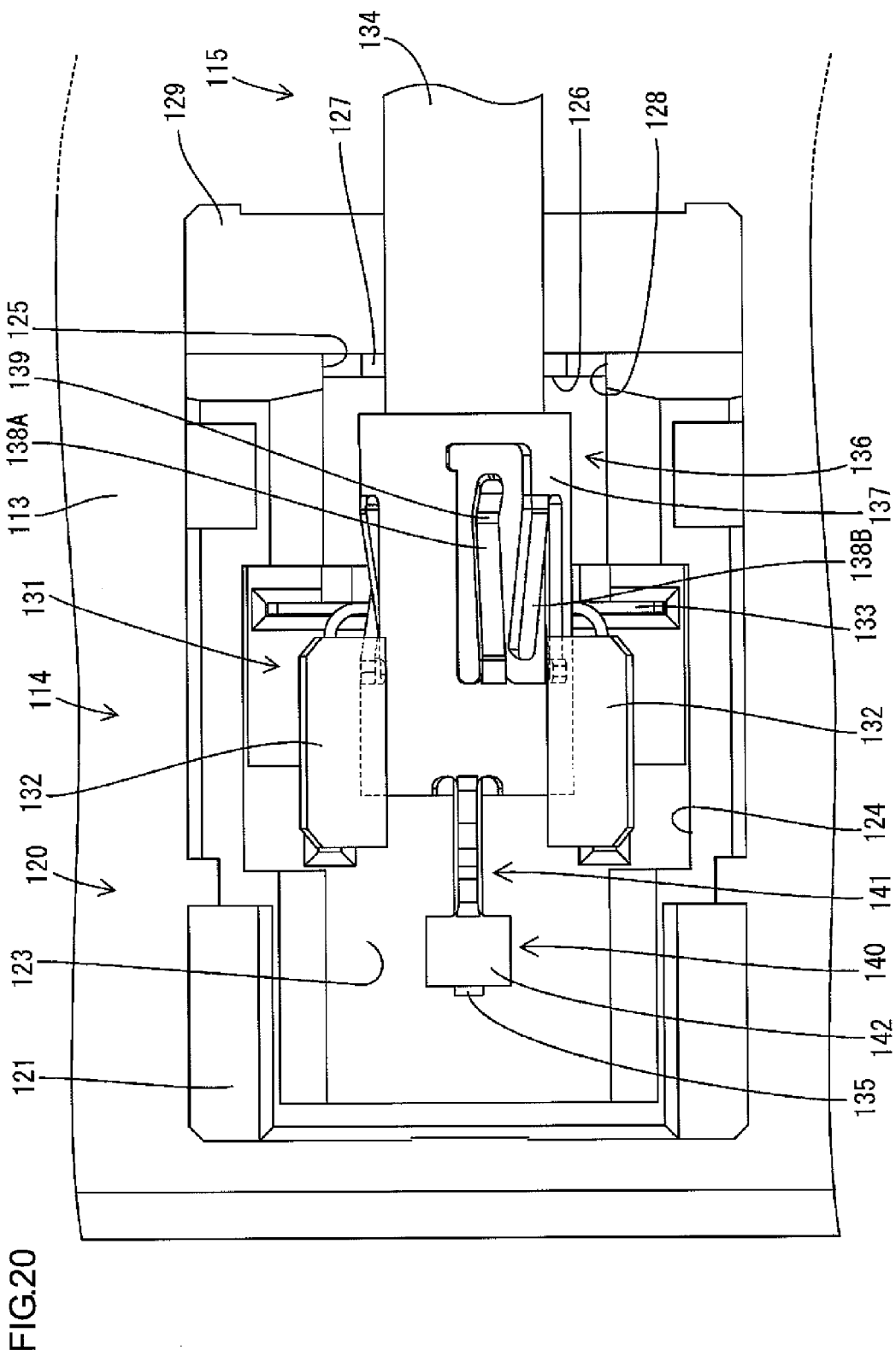
FIG. 20 is a partially-enlarged front view showing a connecting structure between a relay connector and a discharge tube.
Figure 21:
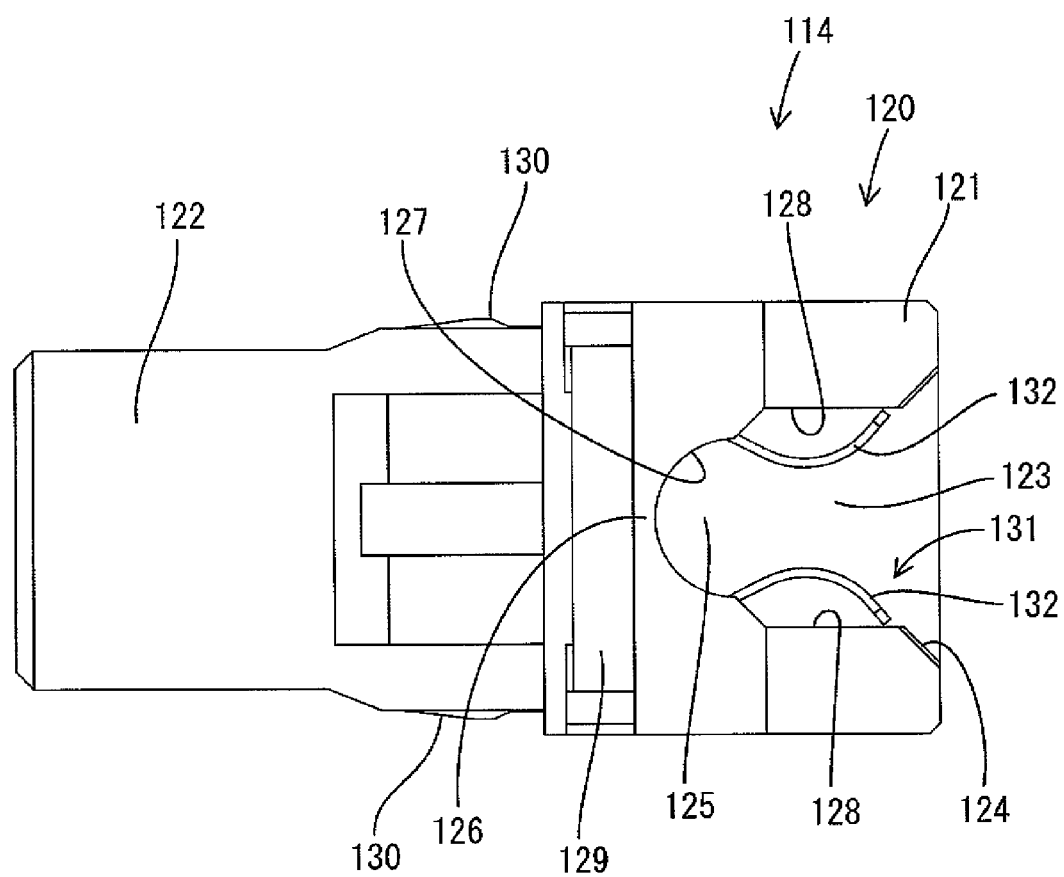
FIG. 21 is a side view of a relay connector.
Figure 22:
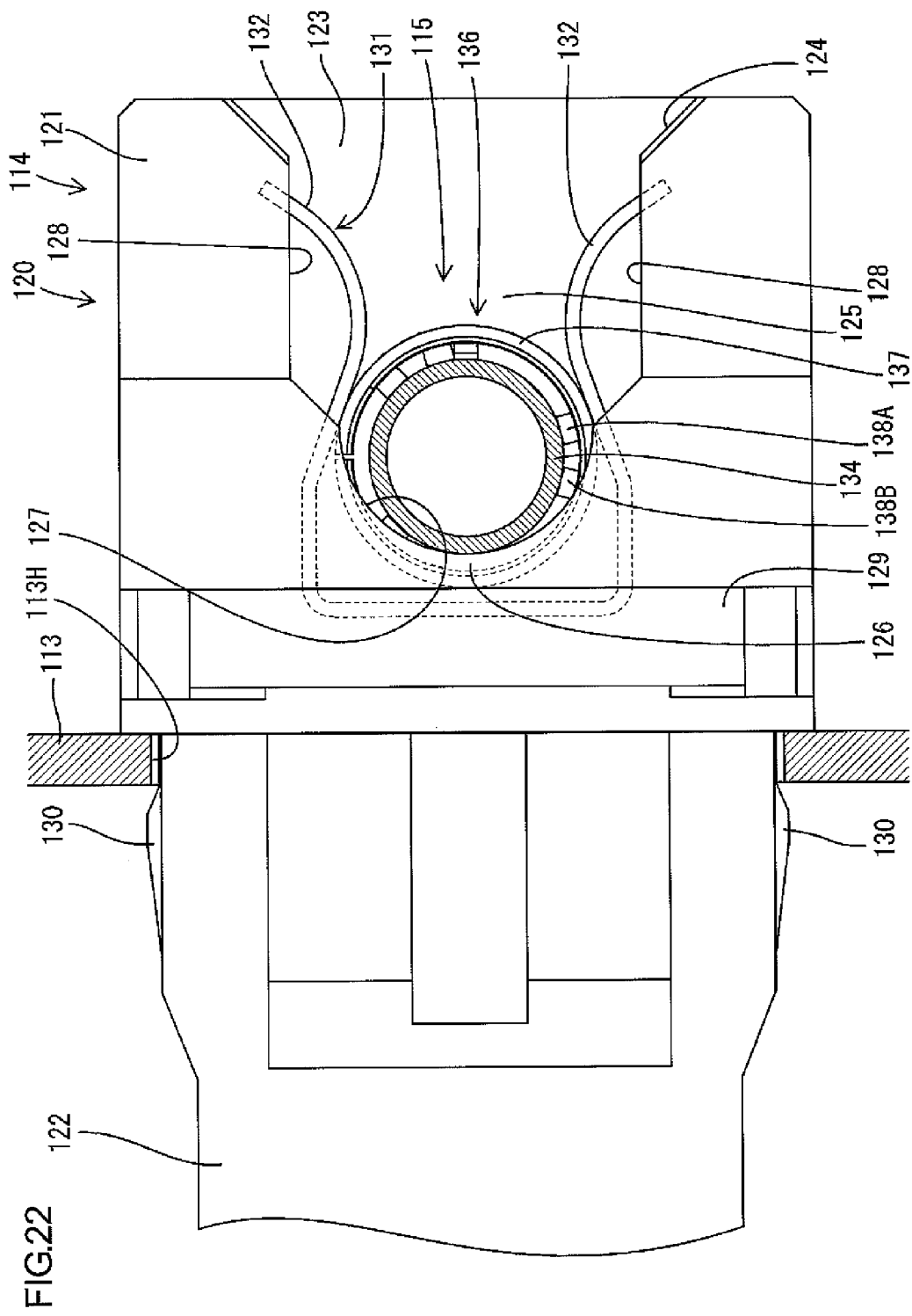
FIG. 22 is a sectional view showing that a ferrule on a discharge tube is capable of engaging with a stopper.
Figure 23:
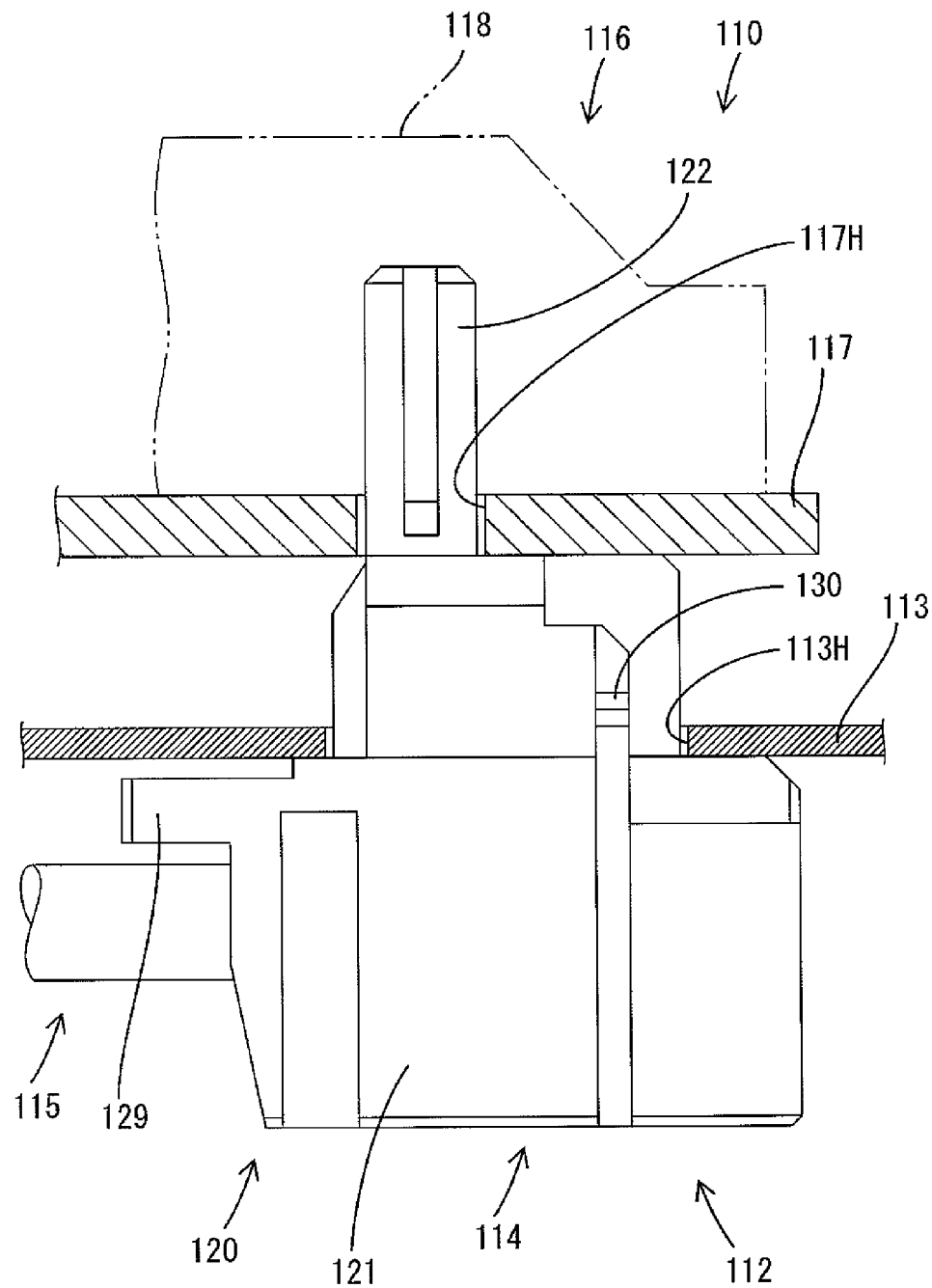
FIG. 23 is a sectional view showing a connecting structure between a relay connector and a power board.
Figure 24:
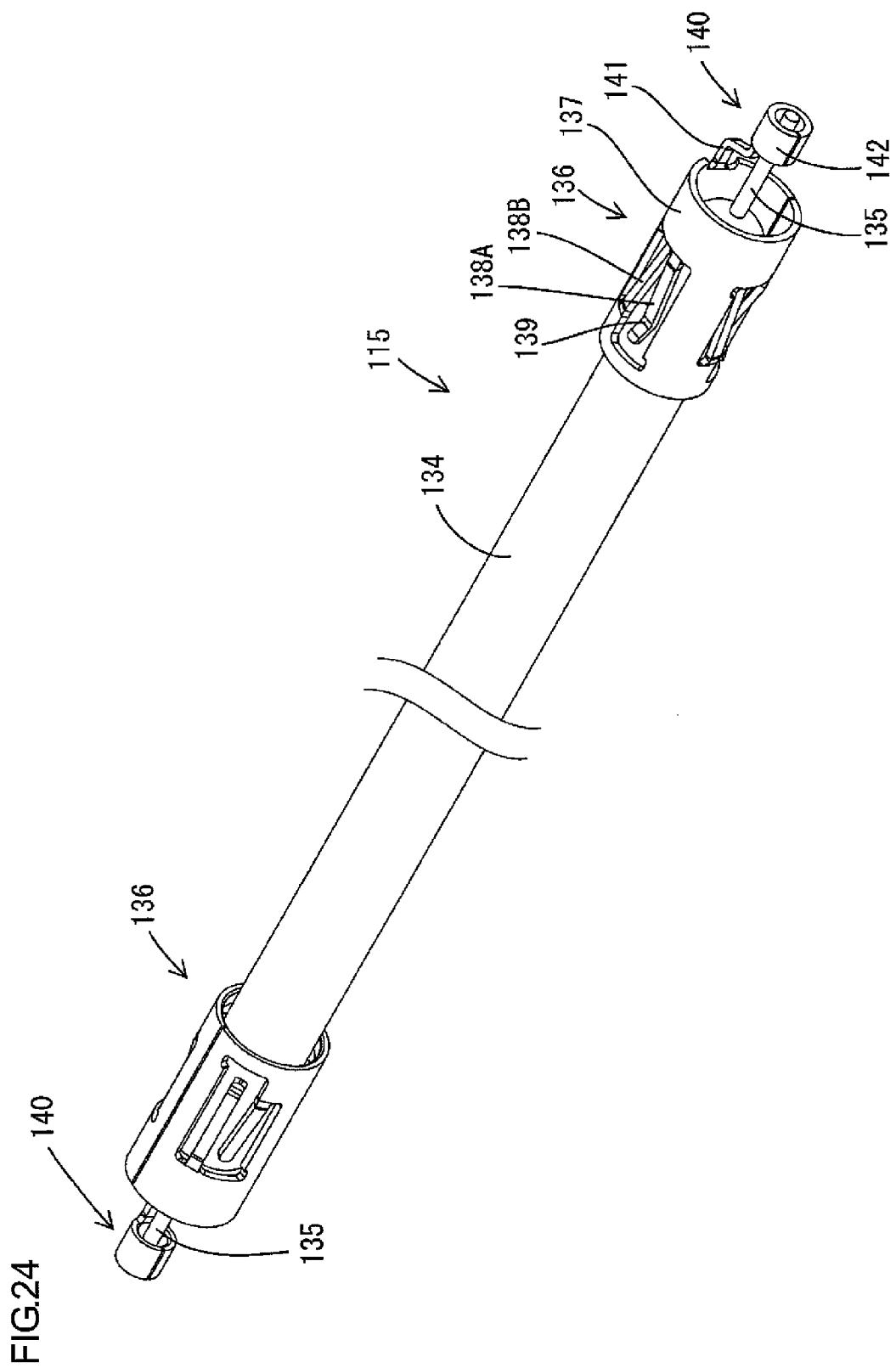
FIG. 24 is a perspective view of a discharge tube.
Figure 25:
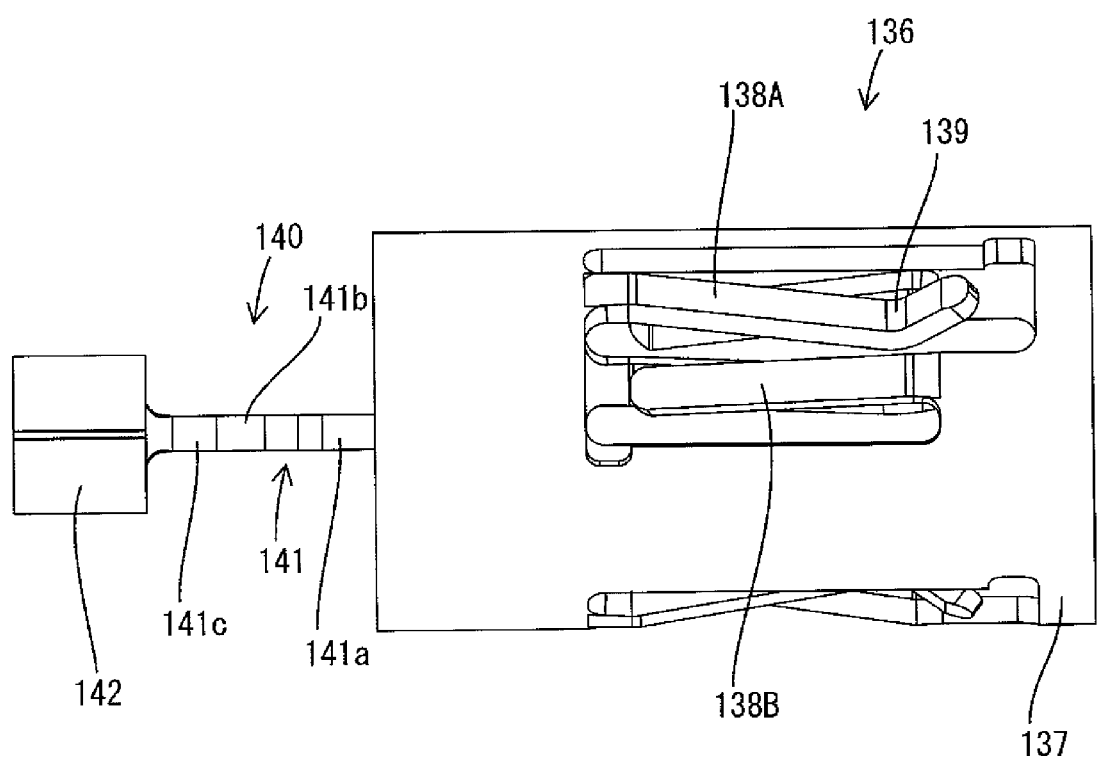
FIG. 25 is a rear view of a ferrule.
Figure 26:
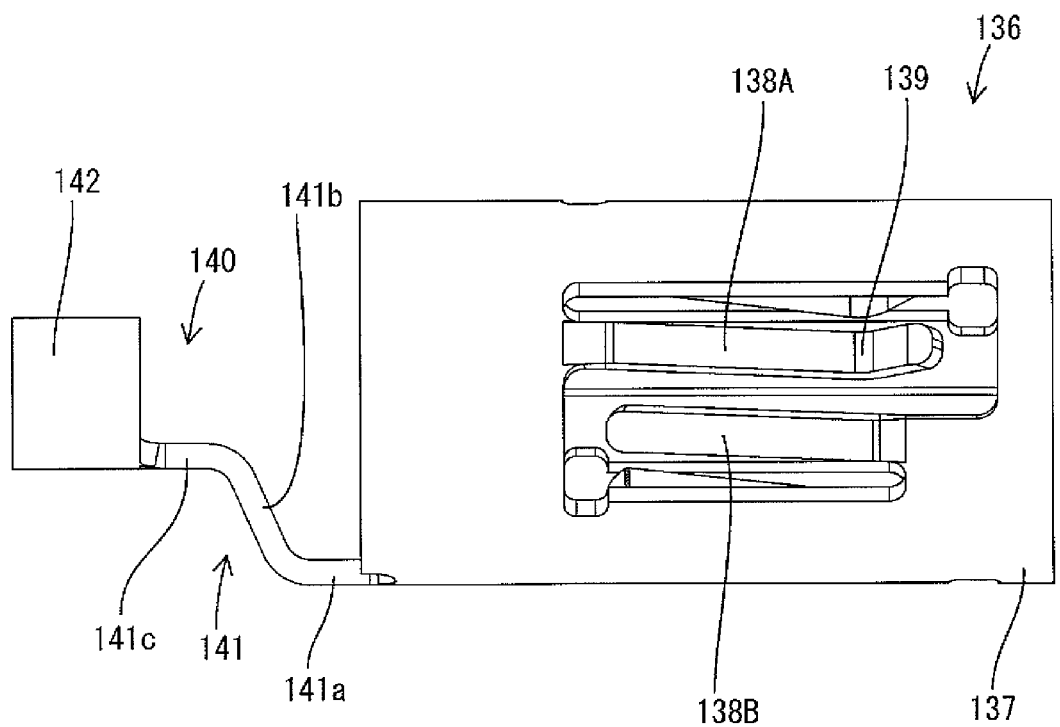
FIG. 26 is a plan view of the ferrule.
Figure 27:
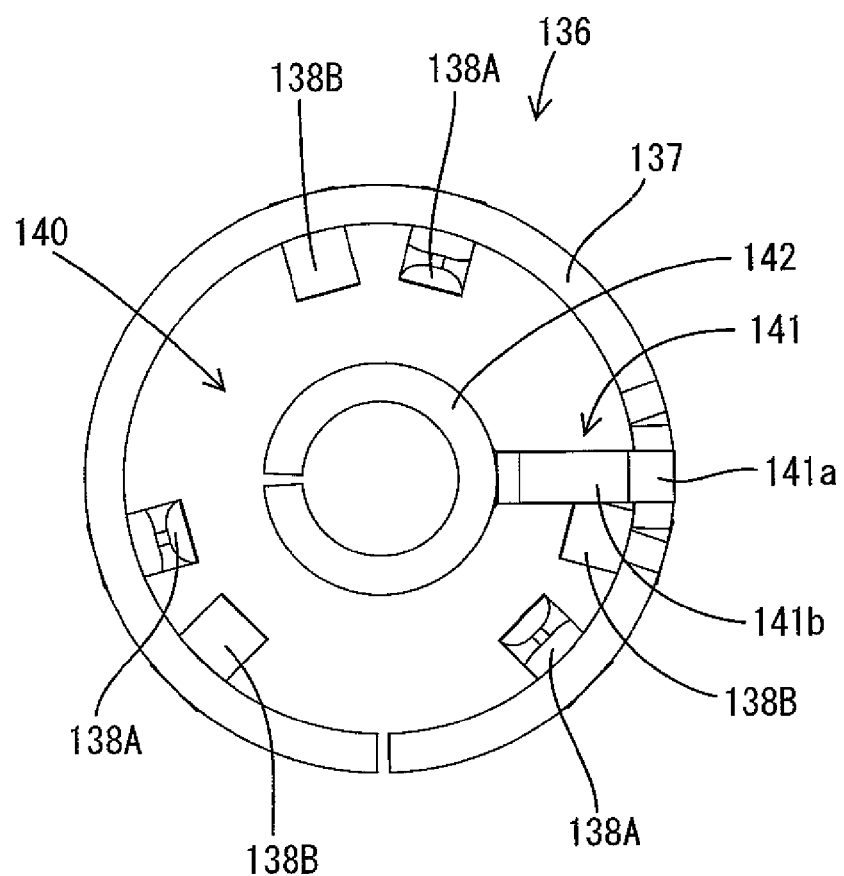
FIG. 27 is a side view of the ferrule.
Figure 28:
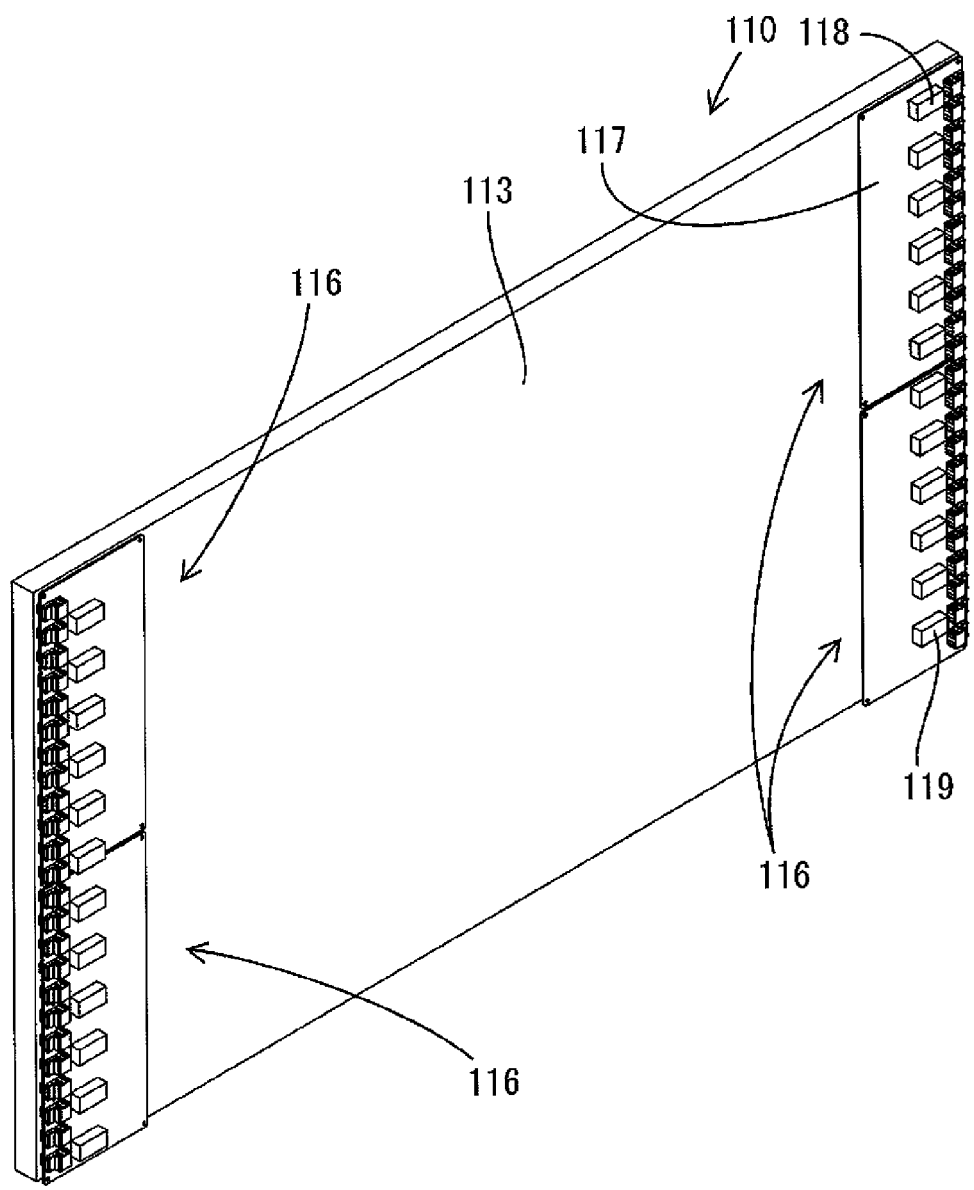
FIG. 28 is a rear perspective view of the lighting device.
Figure 29:
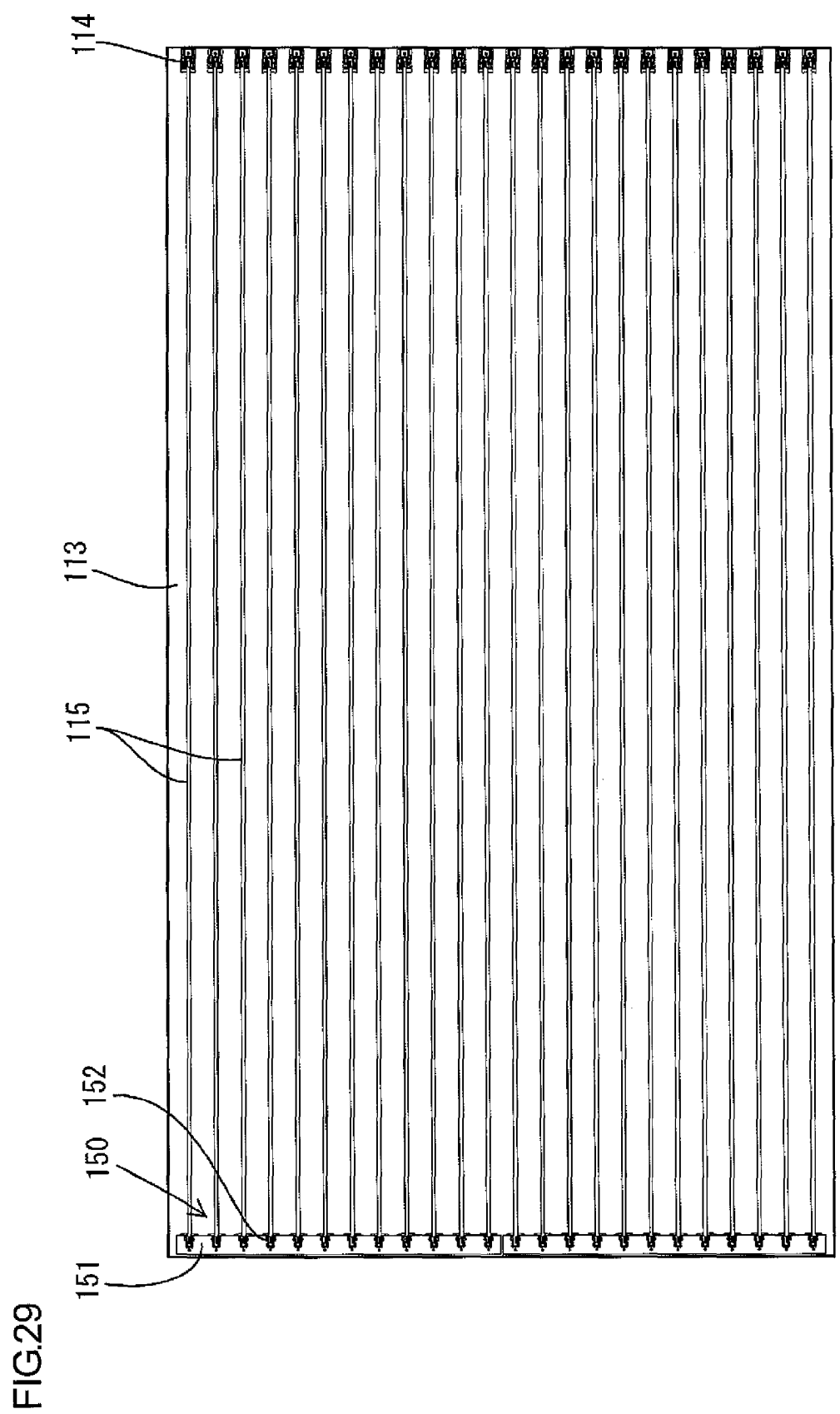
FIG. 29 is a front view of a lighting device according to preferred embodiment 3 of the present invention.
Figure 30:
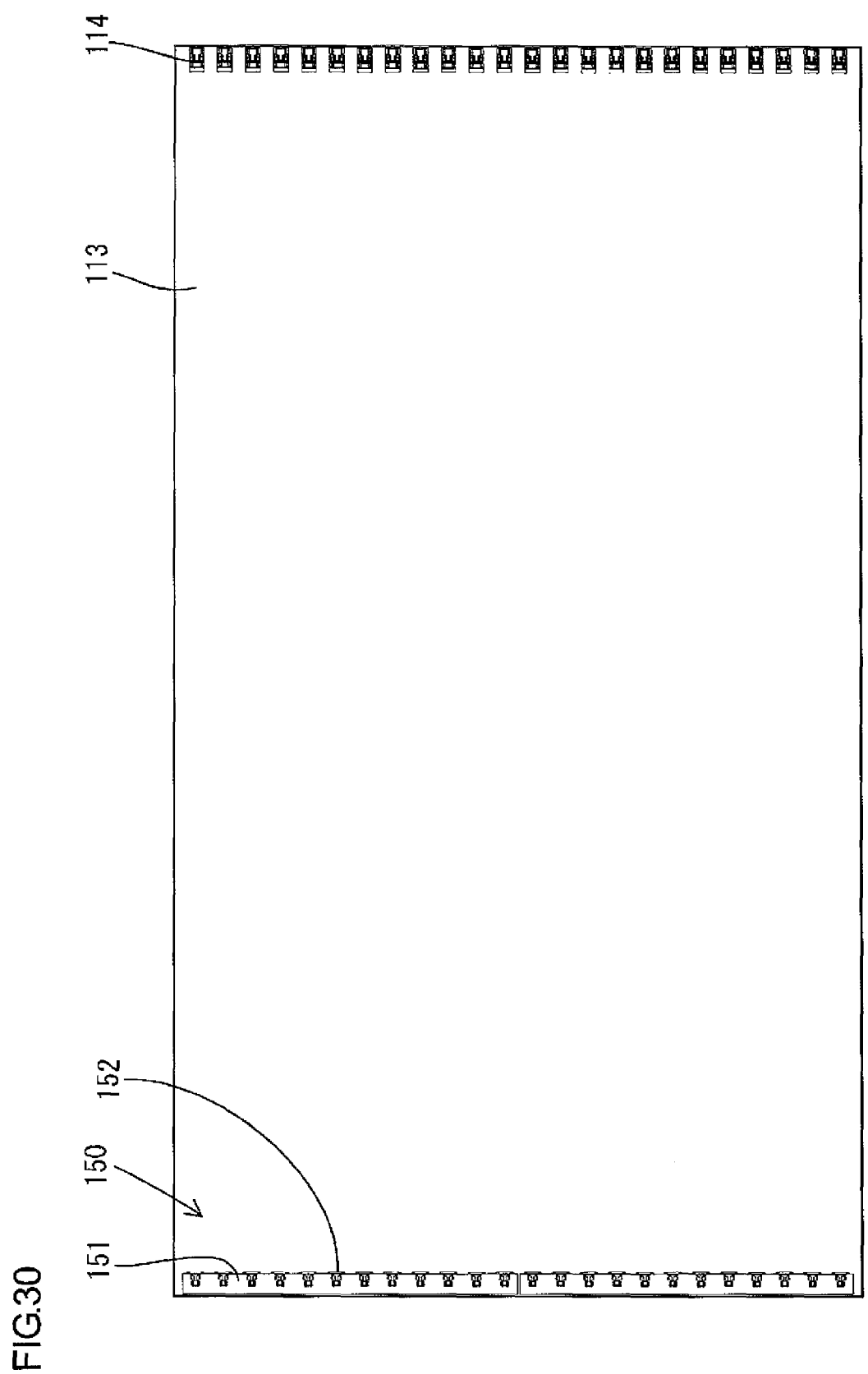
FIG. 30 is a front view showing the lighting device, from which discharge tubes are detached.
Figure 31:
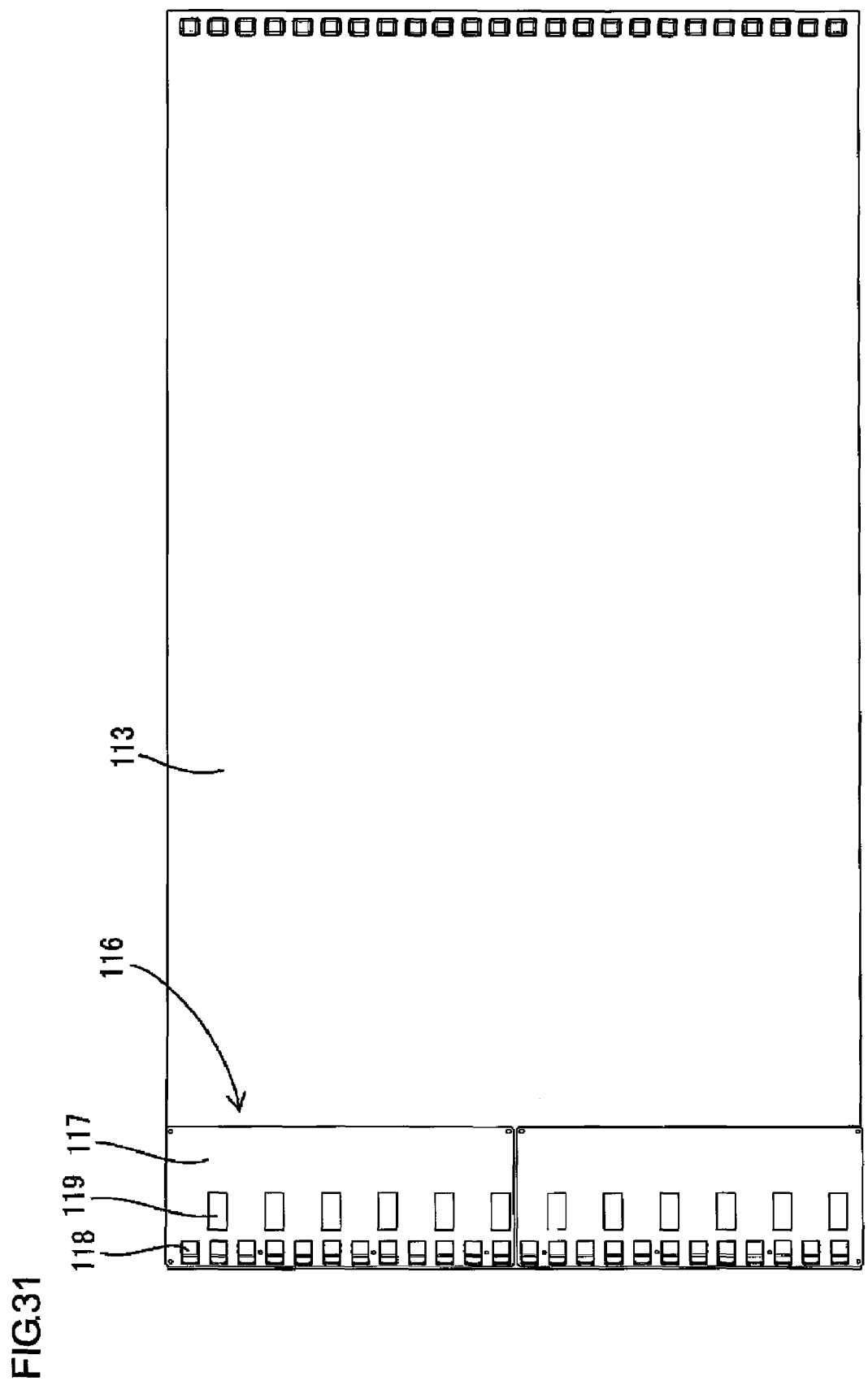
FIG. 31 is a rear view of the lighting device.
Figure 32:
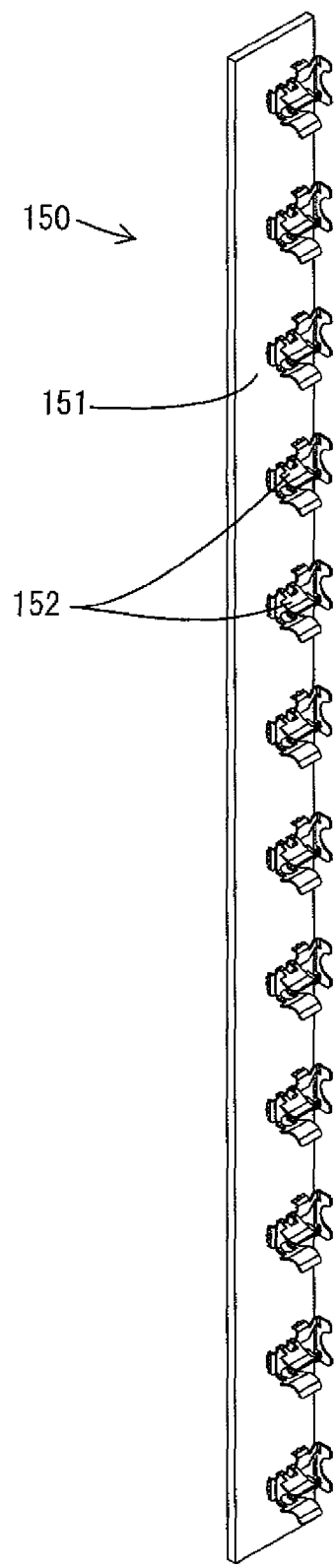
FIG. 32 is a perspective view of a grounding member.
Figure 33:
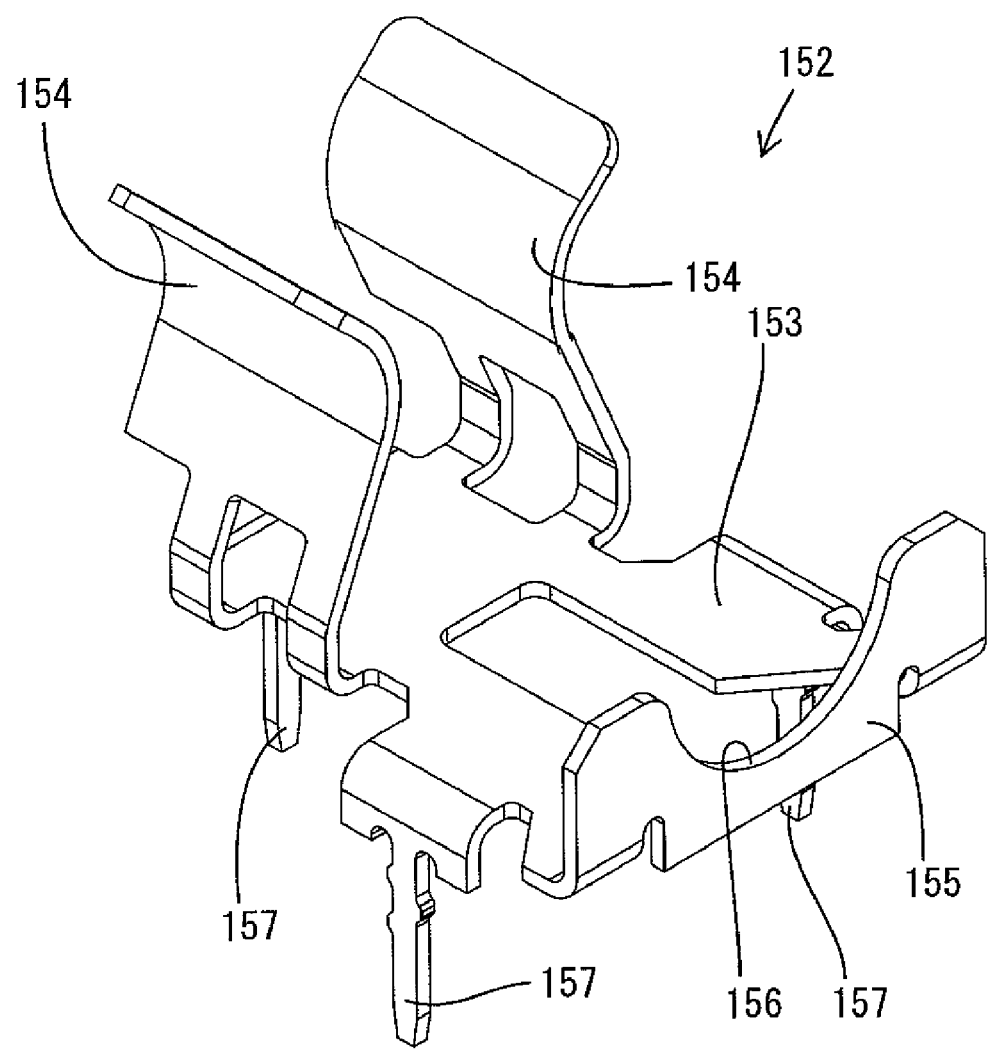
FIG. 33 is a perspective view of a grounding terminal.
Figure 34:
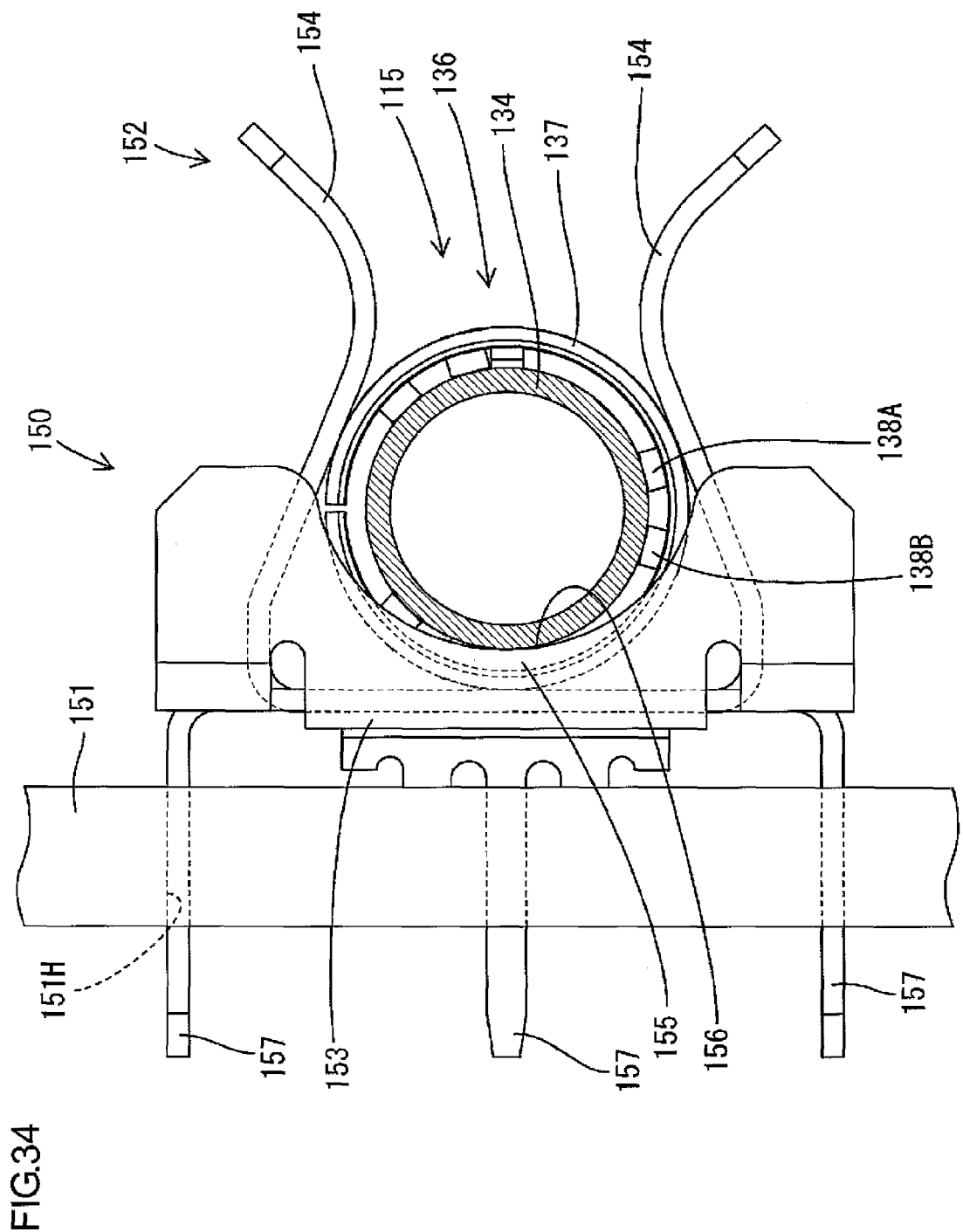
FIG. 34 is a sectional view showing that a ferrule on a discharge tube is capable of engaging with a stopper.
Figure 35:
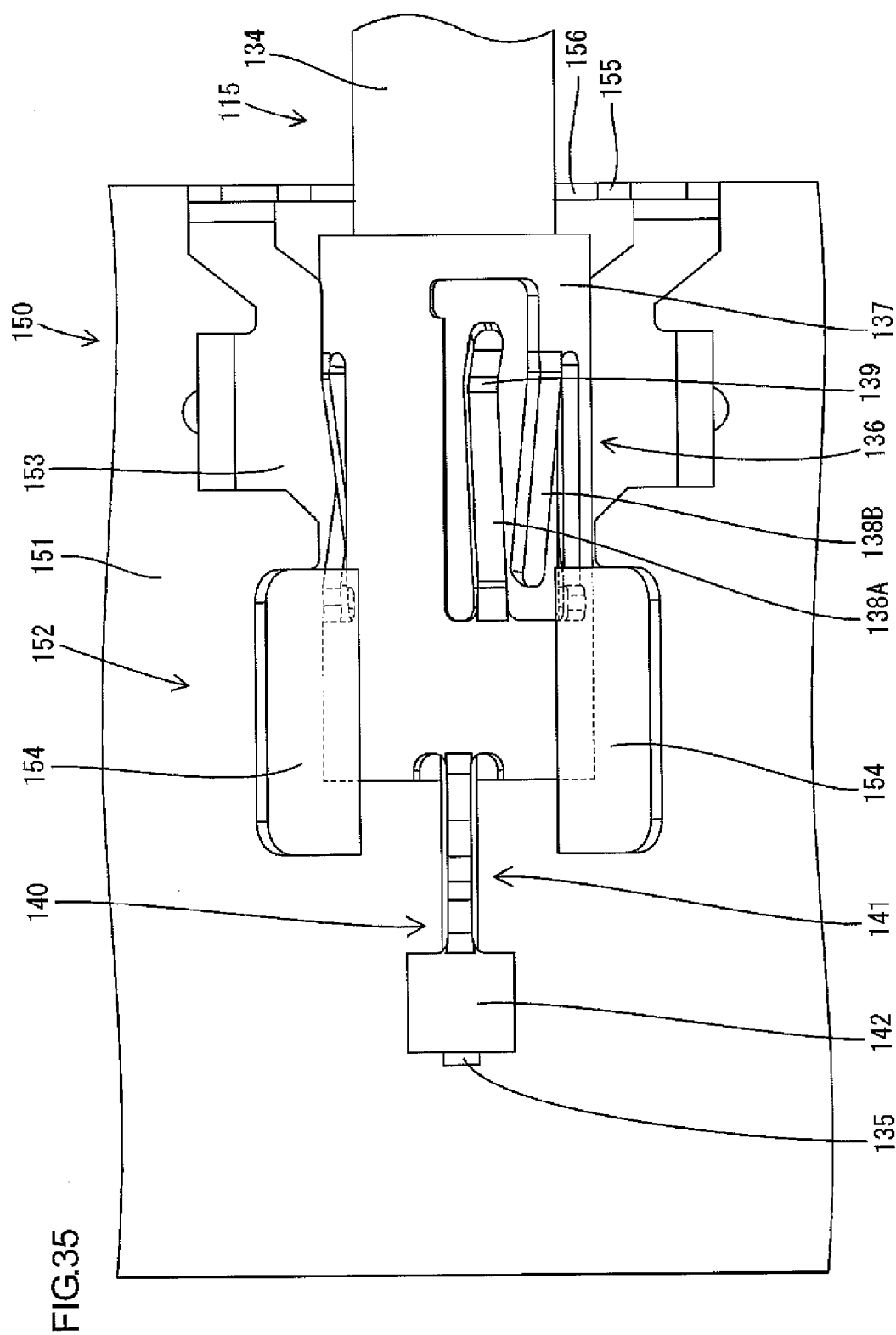
FIG. 35 is a partially-enlarged front view showing a connecting structure between a grounding terminal and a discharge tube.

Preferred embodiment 1 according to the present invention will be hereinafter explained with reference to FIGS. 1 to 16.
Overview of Display Device D A display device D is a liquid crystal display device including a display panel 11 and a lighting device 10 as shown in FIG. 1, which preferably has a horizontally-elongated rectangular shape as a whole. The display panel 11 is disposed on the front side of the lighting device 10, so that the lighting device 10 as a backlight can illuminate the display panel 11 from the back side. The display device D can be applied to a television receiver. As shown in FIG. 16, the television receiver includes the display device D, and front and back cabinets Ca and Cb capable of holding the display device D therebetween. Further included are a power source P other than a power board 16 described below, a tuner T and a stand S. FIG. 1 schematically shows the display device D, and therefore the shapes of relay connectors 14, on-board connectors 18 and the like differ slightly from those in the other figures.

The display panel 11 has a well-known construction, in which liquid crystal as a material with an optical property that changes with applied voltage is disposed in the gap between a transparent TFT substrate and a transparent CF substrate. TFTs (Thin Film Transistors), as switching elements connected to a source wiring line and a gate wiring line running at right angles to each other, are provided on the TFT substrate. A color filter, on which pixels of three primary colors, i.e., Red (R), Green (G) and Blue (B), are arranged in a matrix, is provided on the CF substrate.
Overview of Lighting Device 10

The lighting device 10 includes a lamp unit 12 and power boards 16. The lamp unit 12 includes a metallic chassis 13, which preferably has a horizontally-elongated rectangular plate shape and functions as a reflector plate. Further included are a plurality of discharge tubes 15 held in a horizontal position and vertically arranged on the front side of the chassis 13 so as to be parallel or substantially parallel to one another, and a plurality of relay connectors 14 which are vertically arranged along the lateral edges of the chassis 13 so as to correspond to the discharge tubes 15. The power boards 16 are disposed on the back side of the chassis 13 so as to supply power to the discharge tubes 15 via the relay connectors 14.

A plurality of mounting holes 13H corresponding to the ends of the discharge tubes 15 are formed through the chassis 13 so as to extend from the front side to the back side, and are vertically arranged so as to be level with the respective discharge tubes 15. The relay connectors 14 are mounted through the respective mounting holes 13H. Each relay connector 14 includes a holder 20 made of synthetic resin, and a metallic relay terminal 30 housed in the holder 20.

A pair of upper and lower elastic retaining portions 25 and a pair of right and left engaging surfaces 26 are provided on the outer surface of the holder 20. The holder 20 is inserted into the mounting hole 13H from the front side of the chassis 13, and is fixed to the chassis 13 due to the engaging surfaces 26 in abutting contact with the opening edge of the mounting hole 13H on the front surface of the chassis 13 and due to the retaining protrusions of the elastic retaining portions 25 being locked by the opening edge of the mounting hole 13H on the back surface of the chassis 13. When attached to the chassis 13, the front end portion of the holder 20 projects to the front side of the chassis 13, while the back end portion of the holder 20 projects to the back side of the chassis 13.

A container room 23 is formed in the projecting portion of the holder 20 on the front side of the chassis 13, by removing the front surface and one lateral surface thereof. A plate-shaped wall portion 27 is formed on the projecting portion of the holder 20 on the back side of the chassis 13. The relay terminal 30 is disposed in the holder 20. The relay terminal 30, which can be formed, for example, by bending a metallic plate that is formed into a predetermined shape by punching, includes a tube connecting portion 31 having a pair of upper and lower elastic nipping portions 32 formed of plates having a substantially circular arc shape, and further includes a plate-shaped board connecting portion 33 projecting to the back side. The tube connecting portion 31 is disposed in the container room 23, while the board connecting portion 33 is arranged along the wall portion 27.

Each discharge tube 15 is formed of a cold cathode fluorescent tube that includes a generally elongated straight glass tube 40 having a circular cross section, elongated outer leads 42 which have a circular cross section and project linearly from the respective ends of the glass tube 40 and coaxially with the glass tube 40, and further includes ferrules 50 attached to the respective end portions of the glass tube 40. Each ferrule 50, which can be formed by bending or hammering a metallic (e.g., copper alloy) plate that is formed into a predetermined shape by punching, for example, includes a body 51 and a conductive portion 57. The body 51 preferably has a substantially cylindrical shape, which is attached on the outer circumference of the glass tube 40. The conductive portion 57 extends from the end edge of the body 51 so as to have elastic contact with the outer periphery of the outer lead 42, and is preferably fixed by welding, for example. The discharge tube 15 is mounted to the chassis 13, so that the end portions thereof are fitted into the container rooms 23 of the holders 20 while tube connecting portions 31 have elastic contact with the outer circumferences of the bodies 51 of the ferrules 50.

Overview of Power Board 16

Each power board 16 includes a circuit board 17 having a circuit provided on its back surface (i.e., the surface on the opposite side of the chassis 13), electronic components 19 mounted on the back surface of the circuit board 17, and a plurality of on-board connectors 18 mounted on the back surface of the circuit board 17.

The circuit board 17 preferably has a vertically-elongated rectangular shape as a whole, and a phenolic paper-base copper-clad laminated board (known as a phenolic paper) is used as a material therefor. A plurality of fitting holes 17H having a vertically-elongated rectangular shape are formed through the circuit board 17 so as to extend from the front side to the back side. The plurality of fitting holes 17H are arranged vertically along the lateral edge portion 17E (or side edge portion) of the circuit board 17 so as to correspond to the above-described relay terminals 30 (or relay connectors 14). Further, a plurality of positioning holes 17a are formed through the circuit board 17 so as to extend from the front side to the back side. The positioning holes 17a are arranged between the fitting holes 17H and the side edge of the circuit board 17 so that a pair of upper and lower positioning holes corresponds to each fitting hole 17H.

Overview of On-Board Connector 18

The on-board connectors 18 are arranged along the lateral edge of the circuit board 17 so as to correspond to the respective fitting holes 17H, and are engaged with the respective relay connectors 14 through the fitting holes 17H. Each on-board connector 18 includes a housing 60 made of an insulating material such as a synthetic resin, and further includes a metallic output terminal 70 completely contained in the housing 60.

Housing 60

The housing 60 preferably is a single-piece component that includes a terminal holding portion 61 and an insulating portion (i.e., a reinforcing portion) 62. The terminal holding portion 61 preferably has a block-shaped configuration, in which an engaging recess 63 is formed so as to have a vertically-elongated rectangular opening on the outer surface (i.e., the circuit board 17 facing surface) of the housing 60. The position and size of the engaging recess 63, when the on-board connector 18 is mounted to the circuit board 17, are set to correspond substantially to those of the fitting hole 17H. The relay connector 14 can be fitted into the engaging recess 63. In the engaging recess 63, a pair of upper and lower positioning portions 64 are preferably rib-shaped protrusions arranged so as to protrude from the inside surface closer to the edge portion 17E of the circuit board 17. The pair of positioning portions 64 are vertically located at substantially the center of the engaging recess 63.

Further, a holding groove 65, in which the output terminal 70 is mounted (or held), is provided within the terminal holding portion 61. The holding groove 65 is formed so as to traverse the engaging recess 63 and have an elongated opening extending on the circuit board 17 facing surface of the housing 60 and along the horizontal direction perpendicular or substantially perpendicular to the edge portion 17E of the circuit board 17. The holding groove 65 includes a first groove portion 65a formed of a deep recess on the inside surface of the engaging recess 63 farther from the edge portion 17E of the circuit board 17, a pair of second groove portions 65b formed of recesses extending to the respective upper and lower sides from the far end portion (i.e., the end portion farthest from the edge portion 17E) of the first groove portion 65a, and a third groove portion 65c formed of a recess extending between the pair of positioning portions 64 from the inside surface of the engaging recess 63 closer to the edge portion 17E of the circuit board 17.

The terminal holding portion 61 is formed to be larger than the insulating portion 62, described below, in thickness measured from the back surface of the circuit board 17, so that a substantially step-shaped structure is provided therebetween. A tapered surface 61S is formed on the outer surface of the terminal holding portion 61 on the opposite side of the circuit board 17, by cutting the edge of its insulating portion 62 side corner at an angle of about 45', for example.

The insulating portion 62, i.e., a portion that does not include the output terminal 70, is arranged closer to the edge portion 17E of the circuit board 17 than the terminal holding portion 61, so as to be continuous with the edge portion 17E side surface of the terminal holding portion 61. The circuit board 17 facing surface of the insulating portion 62 is continuous and flush with the circuit board 17 facing surface of the terminal holding portion 61. The insulating portion 62 is the same as the terminal holding portion 61 in width (i.e., length along the vertical direction parallel to the edge portion 17E of the circuit board 17). The upper and lower outer surfaces of the insulating portion 62 are continuous and flush with the respective upper and lower outer surfaces of the terminal holding portion 61. The horizontal length (i.e., length along a direction perpendicular to the edge portion 17E of the circuit board 17) of the insulating portion 62 is substantially half the horizontal length of the terminal holding portion 61. The insulating portion 62 includes a pair of upper and lower thin-walled portions 62a having a block-shaped configuration, and further includes a thick-walled portion 62b arranged between the thin-walled portions 62a and having a block-shaped configuration. The insulating portion 62, when viewed from the edge portion 17E side of the circuit board 17, defines a laterally facing T-shape. Metallic reinforcing pins 66, elongated perpendicularly to the back surface of the circuit board 17, are embedded in the respective thin-walled portions 62a. One end portion of each reinforcing pin 66 projects from the circuit board 17 facing surface of the thin-walled portion 62a to the outside, and is fitted into the positioning hole 17a. The fitting structure between the reinforcing pin 66 and the positioning hole 17a defines a reinforcing mechanism for fixation of the housing 60 to the circuit board 17. The reinforcing pins 66 of the reinforcing mechanism can be formed of metallic terminals, or alternatively, can be formed of synthetic-resin terminals. Soldering, adhesive bonding or welding can be used as a reinforcing method associated with the fitting structure. A positioning recess 62c is formed on the thick-walled portion 62b so as to have a circular opening on its outer surface on the opposite side of the circuit board 17. The positioning recess 62c serves as a positioning means, when a cover not shown, or the like, is mounted to the power board 16 from the back side. The axis thereof is perpendicular to the back surface of the circuit board 17.

Output Terminal 70

The output terminal 70, which can be formed by bending a metallic material that is formed into a predetermined shape by punching, includes a proximal portion 71, a supported portion 74, a flexible portion 72 and a connecting portion 73. The output terminal 70 is mounted into the holding groove 65 from the circuit board 17 facing side of the terminal holding portion 61.

The proximal portion 71 preferably has a substantially rectangular plate-shaped configuration elongated in a direction perpendicular or substantially perpendicular to the back surface of the circuit board 17, so that the surface thereof is arranged substantially parallel to the edge portion 17E of the circuit board 17. A connecting pin 71a having a small width is provided on the proximal end of the proximal portion 71 (so that the connecting pin 71a of the output terminal 70 and the reinforcing pins 66 of the insulating portion 62 are collectively provided at least three positions each). The proximal portion 71 is held in the second groove portion 65b by press fitting, while small protruding portions formed on the lateral edge portions of the proximal portion 71 wedge into the inner walls of the second groove portions 65b. Consequently, the output terminal 70 is held so as to be substantially completely contained in the terminal holding portion 61, except for the connecting pin 71a. The connecting pin 71a penetrates through a connecting hole 17b of the circuit board 17, and is connected to the circuit. The housing 60 is fixed to the circuit board 17 due to the connecting pin 71a fitted into the connecting hole 17b.

The supported portion 74 preferably has an elongated shape having a width smaller than that of the proximal portion 71, and is arranged in the deep portion of the first groove portion 65a, i.e., arranged away from the opening thereof. The supported portion 74 extends substantially perpendicularly from the end portion of the proximal portion 71 on the opposite side of the connecting pin 71a toward the edge portion 17E side of the circuit board 17. That is, the supported portion 74 is elongated in a direction substantially parallel to the back surface of the circuit board 17 and substantially perpendicular to the edge portion 17E of the circuit board 17. The supported portion 74 is smaller than the proximal portion 71 in length.

The flexible portion 72 preferably has an elongated shape having the same width as the supported portion 74, and extends substantially perpendicularly (or substantially parallel to the proximal portion 71) from the distal end (i.e., the end portion on the opposite side of the proximal portion 71) of the supported portion 74. The flexible portion 72 is slightly smaller than the proximal portion 71 in length. The flexible portion 72 is held in the first groove portion 65a, so as to be capable of being slanted at an acute or obtuse angle to the supported portion 74, due to its elastic deformation.

The connecting portion 73 preferably has an elongated shape having the same width as the flexible portion 72, and specifically has a substantially U-shape having a narrowed open end. The connecting portion 73 includes a first strip portion 73a that loops back at the distal end of the flexible portion 72 and extends in a direction away from the circuit board 17, and further includes a second strip portion 73b that loops back at the distal end of the first strip portion 73a and extends in a direction toward the circuit board 17. On the connecting portion 73, the distance between the strip portions 73a, 73b is partly set to be shorter. The shorter-distance portions of the strip portions 73a, 73b are located in the engaging recess 63. The first strip portion 73a is arranged along the inside surface of the engaging recess 63 farther from the edge portion 17E of the circuit board 17, so as to be partly contained in the first groove portion 65a. The second strip portion 73b is arranged along the inside surface of the engaging recess 63 closer to the edge portion 17E of the circuit board 17, so as to be partly contained in the third groove portion 65c (or partly arranged between the pair of positioning portions 64).

Figure 9:
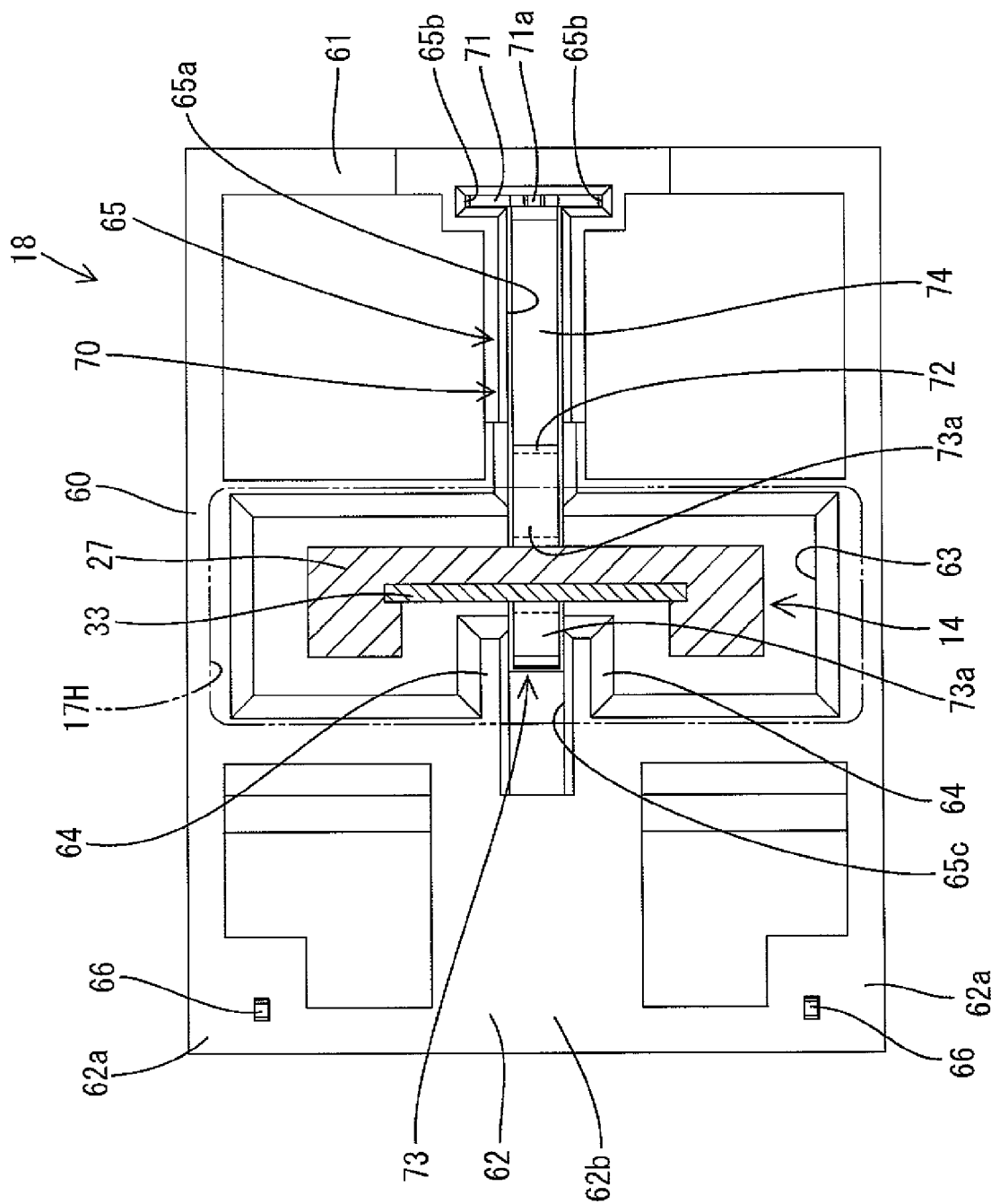
FIG. 9 is a front view of the on-board connector into which a relay connector is fitted.
Figure 10:
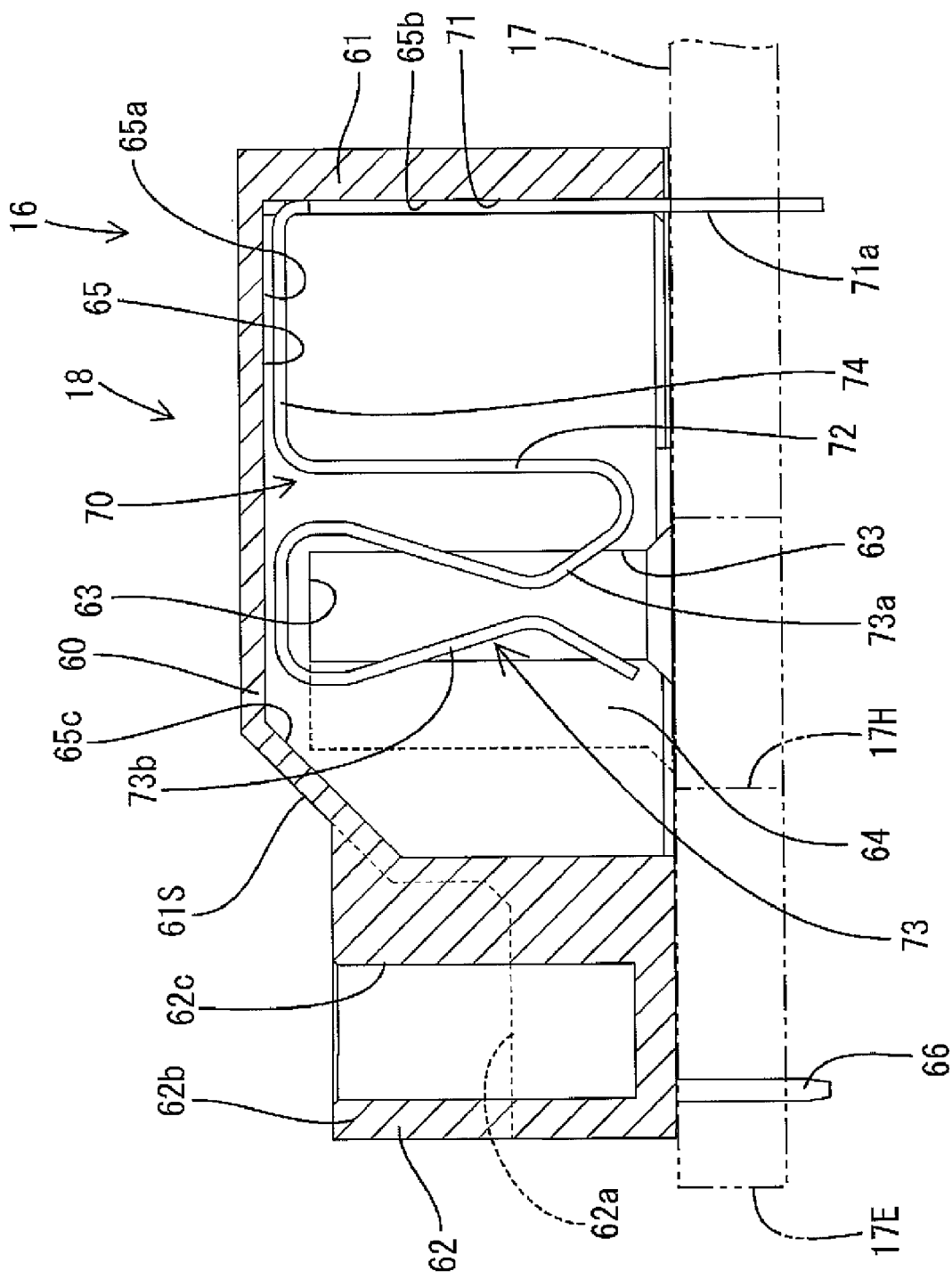
FIG. 10 is a horizontal sectional view of the on-board connector.
Figure 11:
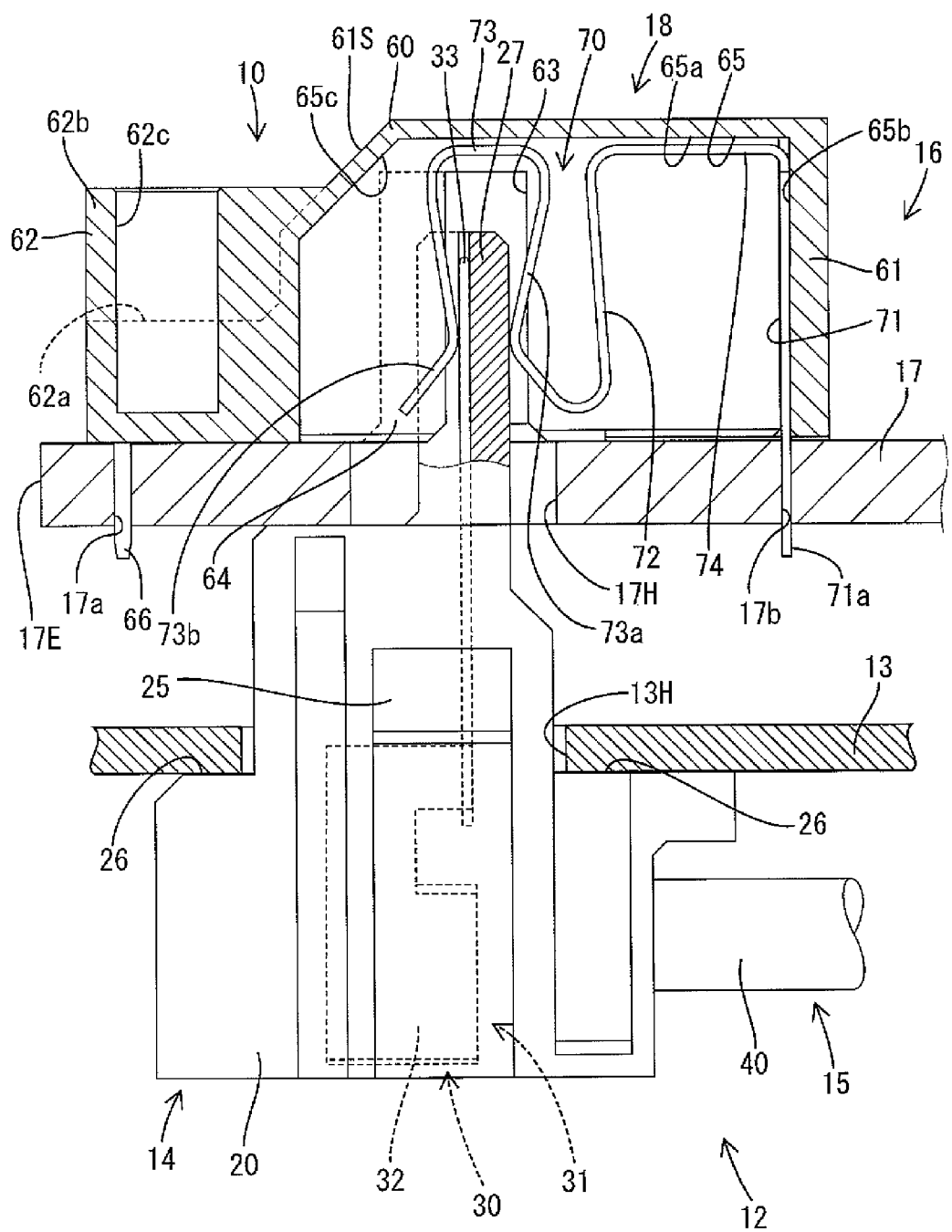
FIG. 11 is a horizontal sectional view showing the on-board connector mounted to a lamp unit.
Figure 12:
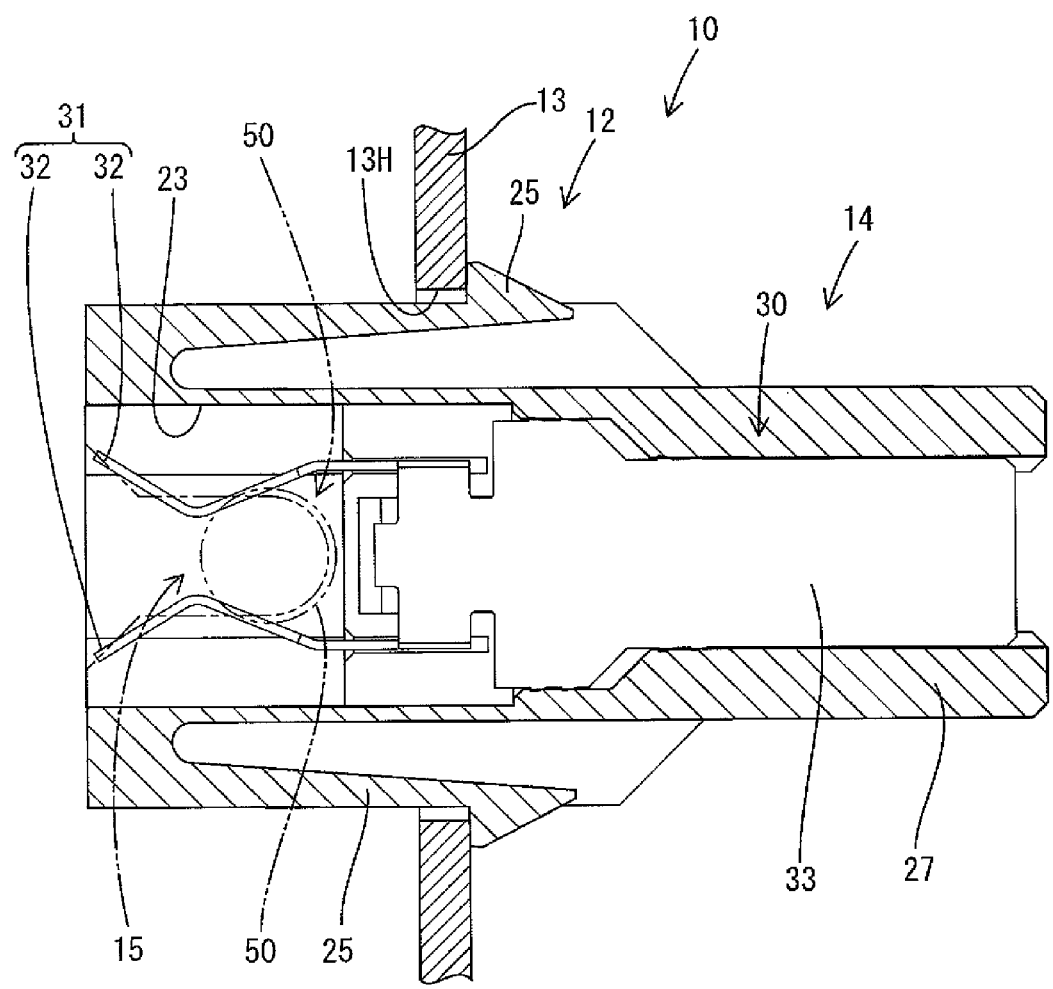
FIG. 12 is a partially-enlarged sectional view of the lamp unit.
Figure 13:
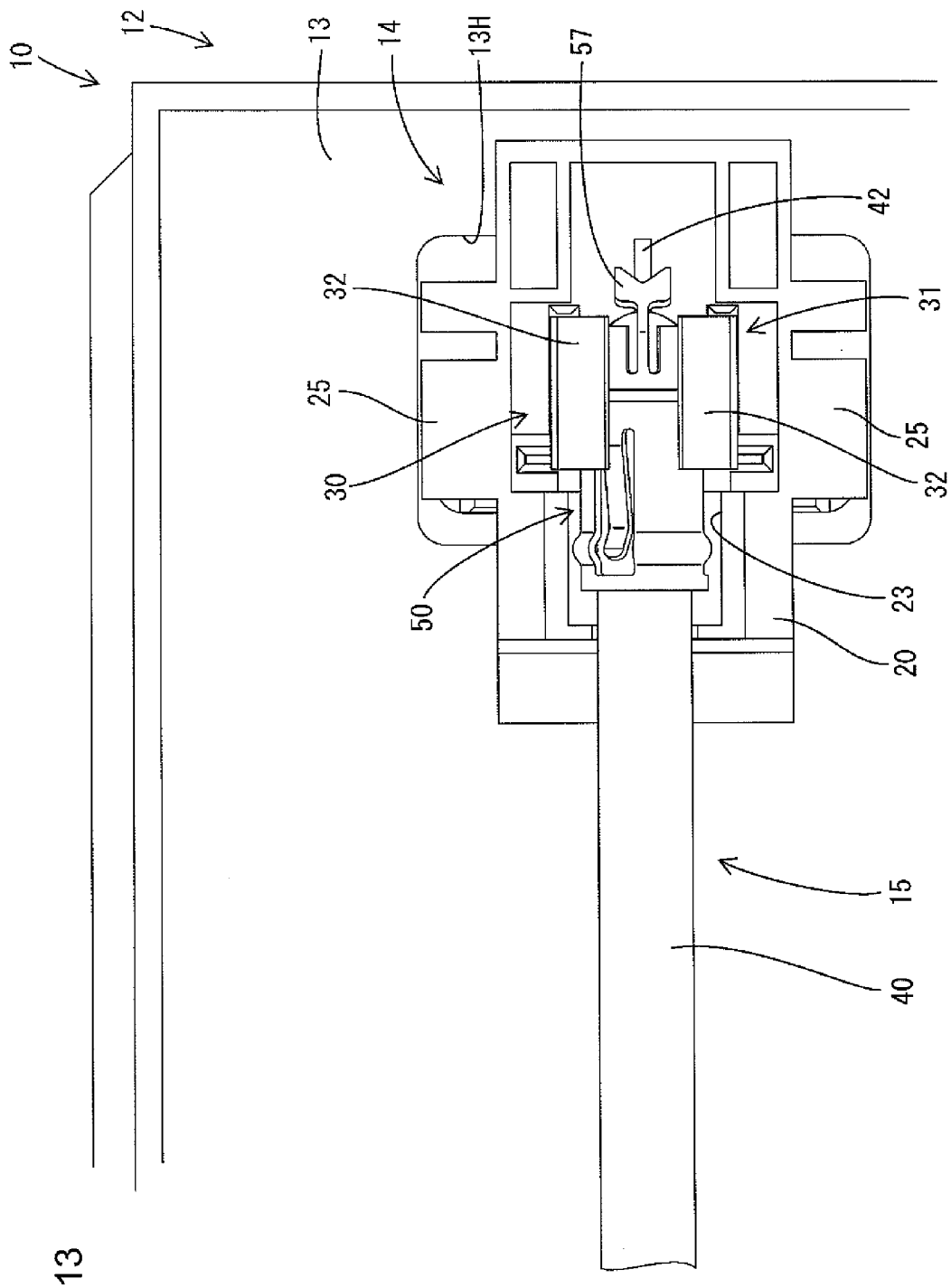
FIG. 13 is a partially-enlarged front view of the lighting device.
Figure 14:
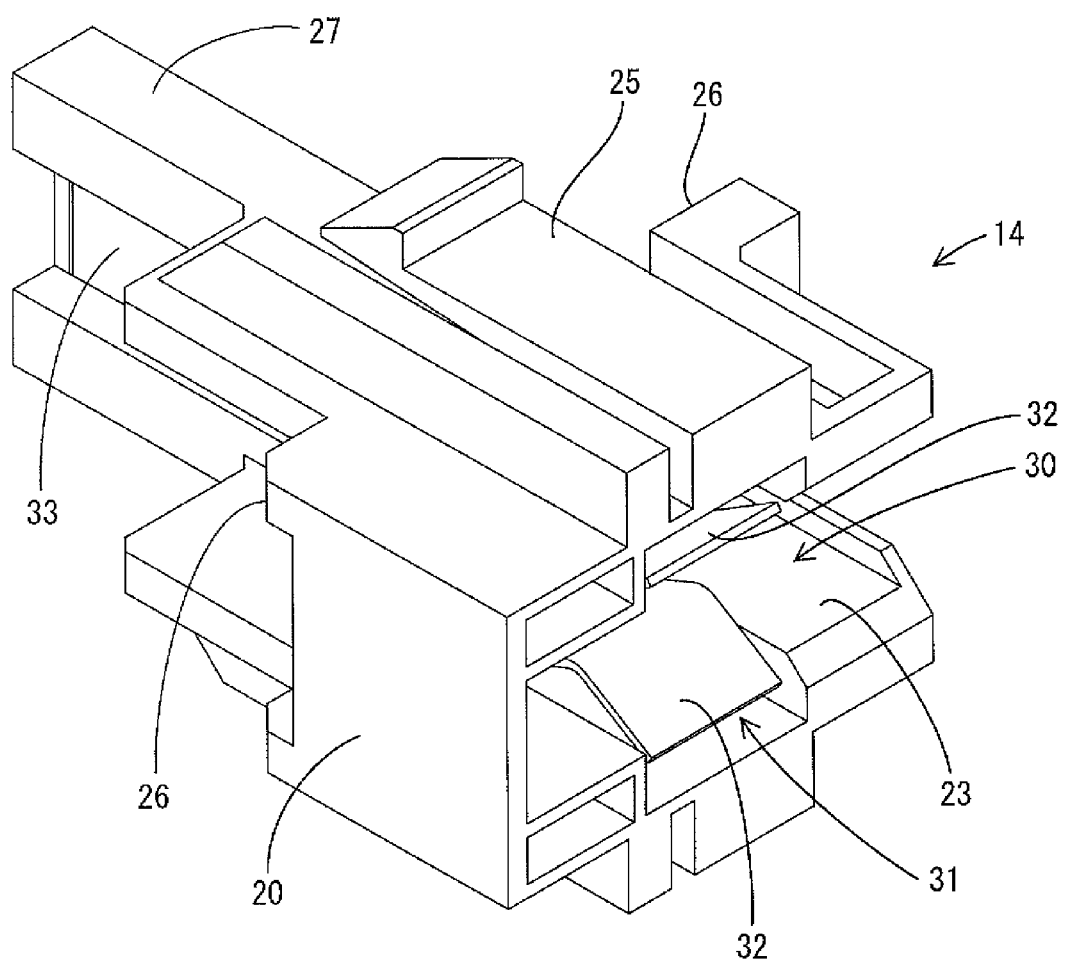
FIG. 14 is a perspective view of a relay connector.
Figure 15:
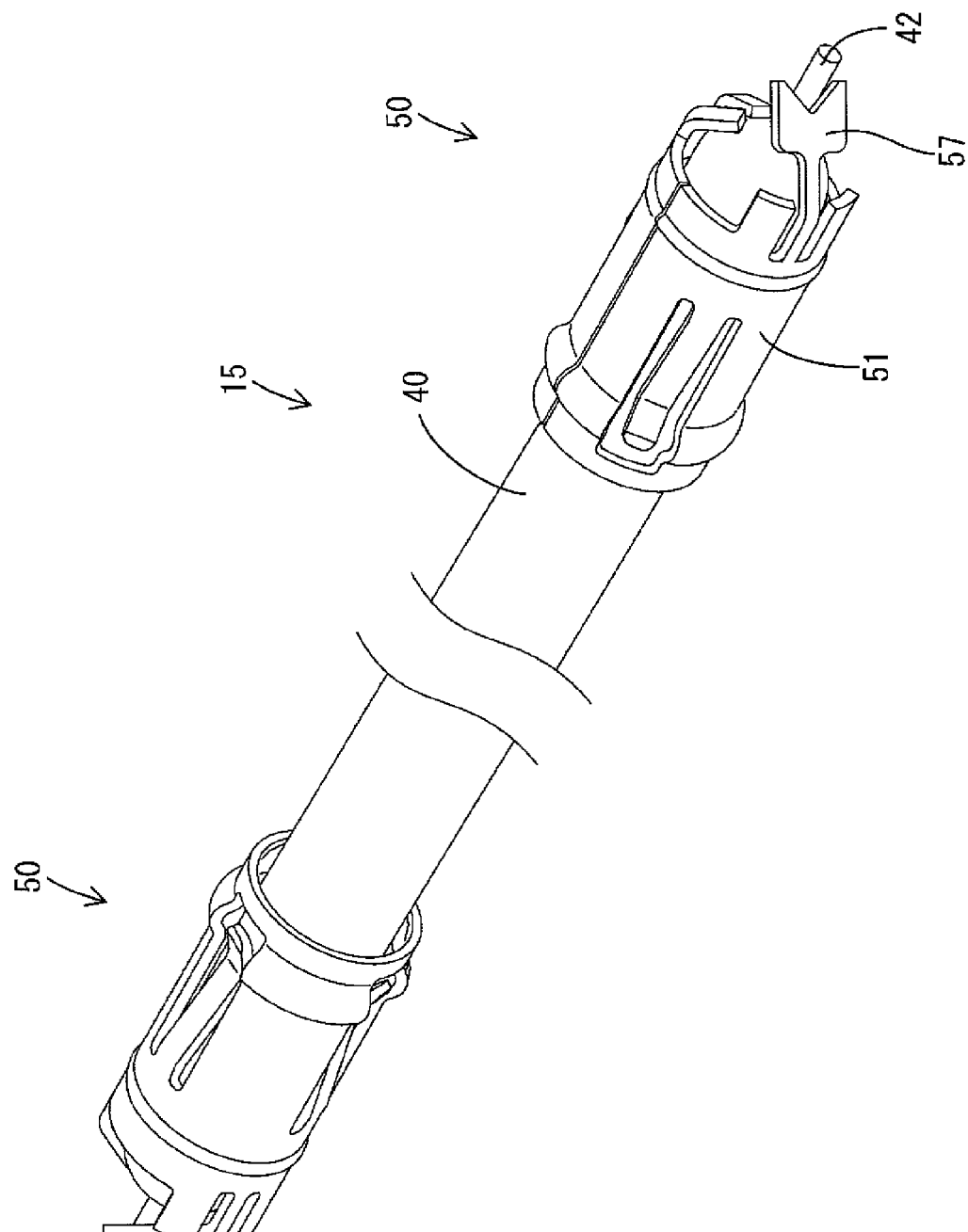
FIG. 15 is a perspective view of a discharge tube.

The power board 16, thus constructed, is mounted to the chassis 13 by being moved toward the chassis 13 from the back side while the circuit board 17 is kept parallel or substantially parallel to the chassis 13. The mounting direction of the on-board connectors 18 to the relay connectors 14 is directly opposite to the mounting direction of the discharge tube 15 to the relay connectors 14. That is, the fitting direction of the on-board connectors 18 is parallel or substantially parallel to the mounting direction of the discharge tube 15 to the relay connectors 14. At the time of fixation, the wall portion 27 of each relay connector 14 and the board connecting portion 33 arranged along the wall portion 27 penetrate the circuit board 17 through the fitting hole 17H, and are inserted into the engaging recess 63 of the on-board connector 18 so as to be placed between the first strip portion 73a and the second strip portion 73b, as shown in FIGS. 9 and 11. Consequently, the wall portion 27 has contact with the first strip portion 73a, while the board connecting portion 33 has contact with the second strip portion 73b. Further, the connecting portion 73 deforms elastically so as to increase the distance between the first strip portion 73a and the second strip portion 73b. The relay connector 14 is thus fitted into the on-board connector 18, and thereby the relay terminal 30 is conductively connected to the output terminal 70. Consequently, the power board 16 is connected to the discharge tubes 15 via the relay connectors 14, so that the power from the power board 16 can be supplied to the discharge tubes 15. When the on-board connectors 18 have reached a proper state of being fitted onto the relay connectors 14, the power board 16 is screwed to the chassis 13.

Operational Effects of the Present Preferred Embodiment

The fitting holes 17H are formed as through holes on the circuit board 17. This enables the on-board connectors 18, provided for connection to the relay terminals 30 on the chassis 13, to be arranged on the back surface of the circuit board 17 on the opposite side of the chassis 13. On the other hand, the electronic components 19 free from restriction of the positional relationship with the chassis 13 can be mounted on the back surface of the circuit board 17, as are the on-board connectors 18. Thus, according to the present preferred embodiment, the power board 16 connected to the relay terminals 30 on the chassis 13 can be achieved as a single-sided power board in which the back surface on the opposite side of the chassis 13 is provided as the single mounting surface.

The output terminal 70 is completely contained in the housing 60 (except for the connecting pin 71a), and thereby can be protected from interference with extraneous or foreign substances.

The relay terminal 30 is inserted into the engaging recess 63 so as to be connected to the output terminal 70 therewithin. Thereby, foreign substances are prevented from interference with the connection between the relay terminal 30 and the output terminal 70.

The output terminal 70 is locked by the positioning portions 64 provided on the inside surface of the engaging recess 63, so that displacement of the output terminal 70 in the vertical direction parallel to the edge portion 17E of the circuit board 17 is restricted. Therefore, the flexural rigidity of the output terminal 70 is not required to be increased for displacement prevention. The reduced flexural rigidity of the output terminal 70, thus provided, results in reduction of the frictional resistance developed when the relay terminal 30 is connected to the output terminal 70. Thus, the operational efficiency when the relay terminal 30 is connected to the output terminal 70 can be improved.

The output terminal 70 is formed to include a proximal portion 71 fixed to the housing 60, a flexible portion 72 extending from the proximal portion 71 (via the supported portion 74) and capable of elastic deflection, and a substantially U-shaped connecting portion 73 extending from the flexible portion 72 and capable of elastically pinching the relay terminal 30. The board connecting portion 33 of the relay terminal 30 can have contact solely with the second strip portion 73b of the two strip portions 73a, 73b of the connecting portion 73, i.e., the free-end-side strip portion on the opposite side of the flexible portion 72.

According to the construction, if the board connecting portion 33 of the relay terminal 30 relatively moves toward the flexible portion 72 side within the engaging recess 63, the whole connecting portion 73 (i.e., both of the first strip portion 73a and the second strip portion 73b) moves to the flexible portion 72 side (or to the proximal portion 71 side), together with the board connecting portion 33, while pushing the flexible portion 72 into elastic deflection. Thus, the connection between the board connecting portion 33 and the second strip portion 73b can be maintained.

Conversely, if the board connecting portion 33 relatively moves to the free end side or to the opposite side of the flexible portion 72, the second strip portion 73b on the free end side is pushed by the relay terminal 30 into movement, without noticeable elastic deflection of the flexible portion 72. Then, the connection between the board connecting portion 33 and the second strip portion 73b can be also maintained. Note that the first strip portion 73a at the time is disengaged from the wall portion 27.

In the construction that includes a plurality of on-board connectors 18 and a plurality of relay terminals 30 arranged in lines, the output terminals 70 may displace in the array direction from the relay terminals 30 due to some reason such as the difference in thermal expansion rate between the non-metallic circuit board 17 as a mounting base for the on-board connectors 18 and the metallic chassis 13 as a mounting base for the relay terminals 30.

In view of this, as shown in FIG. 9, the connecting portion 73 is provided on the output terminal 70 so as to be elongated in a direction substantially perpendicular to the array direction of the on-board connectors 18 (i.e., in the direction perpendicular to the plane of FIG. 9), while the board connecting portion 33 is provided on the relay terminal 30 so as to have a plate-shaped configuration that is parallel or substantially parallel to the array direction of the on-board connectors 18 (i.e., the vertical direction in FIG. 9) and so as to be larger than the connecting portion 73 in width (i.e., length along a direction parallel or substantially parallel to the array direction of the on-board connectors 18). The board connecting portion 33 is arranged to have contact with the connecting portion 73.

According to the construction, the board connecting portion 33 preferably has a large length along the array direction of the on-board connectors 18, and therefore the connection between the board connecting portion 33 and the connecting portion 73 can be maintained even if the relay terminal 30 is displaced in the array direction from the output terminal 70.

In view of a high voltage applied to the output terminal 70 of the on-board connector 18 arranged along the edge portion 17E of the circuit board 17, a leak may occur between the output terminal 70 and an electrical conductor approaching the edge portion 17E of the circuit board 17.

For this reason, in the present preferred embodiment, the output terminal 70 is surrounded by the synthetic-resin housing 60, in which the output terminal 70 is held in the terminal holding portion 61 arranged across the insulating portion 62 from the edge portion 17E of the circuit board 17. Thus, the output terminals 70 are positioned in areas of the housings 60 on the opposite side of the edge portion 17E, resulting in narrow sectional arrangement. Thereby, a low-voltage area is left on a portion (i.e., the insulating portion 62) of the on-board connector 18 located in proximity to the edge portion 17E of the circuit board 17, and a long distance is maintained between the output terminal 70 and the edge portion 17E of the circuit board 17. Therefore, even when an electrical conductor approaches the edge portion 17E of the circuit board 17, a leak between the output terminal 70 and the electrical conductor can be prevented.

On the housing 60, the insulating portion 62, which is arranged closer to the edge portion 17E of the circuit board 17 and does not include the output terminal 70, preferably has a substantially block-shaped configuration provided continuously along the substantially entire width of the housing 60. Thereby, foreign substances can be reliably prevented from approaching the output terminal 70 side from the edge portion 17E of the circuit board 17.

The insulating portion 62 of the housing 60, which is arranged closer to the edge portion 17E of the circuit board 17 and does not include the output terminal 70, can effectively function as a reinforcing mechanism to fix the housing 60 on the circuit board 17.

The output terminal 70 preferably has an elongated shape substantially perpendicular to the edge portion 17E of the circuit board 17, and is positioned, in the width direction (or vertical direction) parallel or substantially parallel to the edge portion 17E of the circuit board 17, so as to be at substantially the center of the housing 60. Thereby, foreign substances can be prevented from approaching the output terminal 70 from either upper side or lower side of the housing 60, resulting in prevention of a leak caused by the approach.

On the housing 60, the terminal holding portion 61 provided for arrangement of the output terminal 70 is preferably larger than the insulating portion 62 not involved in arrangement of the output terminal 70, in thickness measured from the circuit board 17, so that a step-shaped structure is provided therebetween. Therefore, the shape and/or size of the output terminal 70 can be set with increased flexibility.

The edge portion of the terminal holding portion 61 on the insulating portion 62 side is preferably cut into a tapered shape. Therefore, when a cover is attached to the on-board connectors 18, the opening edge of the cover is prevented from catching on the housing 60.

The connecting portion 73 of the output terminal 70, provided as a connecting mechanism to connect to the outside (i.e., to the relay terminal 30), cannot be covered up with the housing 60, for functional reasons. However, the connecting portion 73 is accordingly arranged in the engaging recess 63. Therefore, the connecting portion 73 is less subject to a leak, compared to arranging a connecting portion 73 on the outer surface of the housing 60.

Preferred Embodiment 2

Next, preferred embodiment 2 of the present invention will be explained with reference to FIGS. 17 to 28. In preferred embodiment 2, the construction of the lighting device 110 differs from that of preferred embodiment 1. The other constructions are similar to the above preferred embodiment 1. Therefore, the same constructions are designated by the same symbols, and explanations for the constructions, operations and effects thereof are omitted.

Overview of Lighting Device 110

The lighting device 110 includes a lamp unit 112 and power boards 116. The lamp unit 112 includes a metallic chassis 113, which preferably has a horizontally-elongated rectangular plate shape and functions as a reflector plate. Further included are a plurality of discharge tubes 115 held in a horizontal position and vertically arranged on the front side of the chassis 113 so as to be parallel or substantially parallel to one another, and a plurality of relay connectors 114 which are vertically arranged along the lateral edges of the chassis 113 so as to correspond to the discharge tubes 115. The power boards 116 are disposed on the back side of the chassis 113 so as to supply power to the discharge tubes 115 via the relay connectors 114.

A plurality of substantially rectangular mounting holes 113H corresponding to the ends of the discharge tubes 115 are formed through the chassis 113 so as to extend from the front side to the back side, and are vertically arranged to be level with the respective discharge tubes 115. The relay connectors 114 are mounted through the respective mounting holes 113H.

Relay Connector 114

Each relay connector 114 includes a holder 120 made of synthetic resin, and a relay terminal 131 that is housed in the holder 120 and made of metal (e.g., stainless steel).

The holder 120 includes a box-shaped portion 121 that preferably has a block-shaped configuration as a whole, and further includes a wall portion 122 that projects backward from the back surface of the box-shaped portion 121.

A container room 123 is formed in the box-shaped portion 121, so as to have an opening extending from the front side to the lateral side (i.e., the lateral side on the opposite side of the lateral edge portion of the chassis 113). The front opening portion of the opening of the container room 123 is provided as a receiving opening 124, into which an end portion (or ferrule 136) of the discharge tube 115 is fitted from the front side. The lateral opening portion is provided as an escape opening 125 for preventing interference with the glass tube 134 when the end portion of the discharge tube 115 is held in the container room 123. A stopper 126 is formed on the escape opening 125, so as to bulge inward from the opening edge and form a plate-shaped configuration. Due to the stopper 126, the escape opening 125 is narrowed so as to form a substantially U-shaped opening. The vertical size of the substantially U-shaped escape opening 125 is preferably smaller than the inner diameter of the body 137 of the ferrule 136 and be equal to or slightly larger than the outer diameter of the glass tube 134 of the discharge tube 115. On the escape opening 125, a concave portion 127 having a semicircular shape is formed on the far end portion of the opening edge. The radius of curvature of the concave portion 127 is preferably equal to or slightly larger than the radius of curvature of the outer circumference of the glass tube 134. On the escape opening 125, a pair of upper and lower guiding portions 128 are formed on areas of the opening edge on the front side of the concave portion 127.

On the box-shaped portion 121, an extended portion 129 extending parallel or substantially parallel to the chassis 113 is formed on the lateral surface of the box-shaped portion 121 that includes the escape opening 125. The extended portion 129 extends so as to separate the front surface of the chassis 113 from the escape opening 125. A pair of upper and lower retaining protrusions 130 are provided on the outer surface (i.e., upper surface and lower surface) of the box-shaped portion 121.

The relay terminal 131 is held within the holder 120. The relay terminal 131 can be formed by bending a metallic plate that is formed into a predetermined shape by punching. The relay terminal 131 includes a pair of vertically symmetrical elastic pressing portions 132 defined by curved plates, and further includes a board connecting portion 133 formed as a flat plate-shaped portion that projects to the back side. The pair of elastic pressing portions 132, which are housed in the container room 123, can deflect elastically and vertically so as to increase distance therebetween. The vertical distance between the pair of elastic pressing portions 132 is shortest at a position corresponding to the front side of the concave portion 127 of the stopper 126. The minimum distance between the elastic pressing portions 132, when the elastic pressing portions 132 are not forced into elastic deflection or are in a free state, is preferably smaller than the outer diameter of the body 137 of the ferrule 136 attached on the discharge tube 115. On the other hand, the board connecting portion 133 projects from the back surface of the box-shaped portion 121 so as to be exposed to the outside of the holder 120, and extends backwards along the wall portion 122.

When the relay connector 114 is mounted to the chassis 113, the wall portion 122 of the holder 120 is inserted into a mounting hole 113H from the front side of the chassis 113. Thereby, the outer surface of the box-shaped portion 121 becomes in contact with the opening edge of the mounting hole 113H on the front surface of the chassis 113, while the retaining protrusions 130 are locked by the opening edge of the mounting hole 113H on the back surface of the chassis 113. Thus, the chassis 113 is sandwiched between the outer surface of the box-shaped portion 121 on the front side and the retaining protrusions 130 on the back side. Thereby, the holder 120 is fixed to the chassis 113 so that its movement in the mounting direction (i.e., the through direction of the mounting hole 113H) is restricted. Then, the mounting of the relay connector 114 to the chassis 113 is completed. When the relay connector 114 is attached to the chassis 113, the box-shaped portion 121 as the front end portion of the holder 120 projects (or is exposed) to the front side of the chassis 113 while the wall portion 122 as the back end portion of the holder 120 projects (or is exposed) to the back side of the chassis 113.

Discharge Tube 115

Each discharge tube 115 preferably is formed of a cold cathode fluorescent tube that includes a generally elongated straight glass tube 134 having a circular cross section, and elongated metallic (e.g., nickel or cobalt metal) outer leads 135 which have a circular cross section and project linearly from the respective ends of the glass tube 134 and coaxially with the glass tube 134. Further included are ferrules 136 attached to the respective end portions of the glass tube 134. Mercury is encapsulated in the glass tube 134. Each end portion of the glass tube 134 is melted into a substantially hemispherical shape by heat, and thereby forms a domed portion. The outer lead 135 penetrates the domed portion.

Each ferrule 136 preferably is a single-piece component, which can be formed by bending or hammering a metallic (e.g., stainless steel) plate that is formed into a predetermined shape by punching, for example. The ferrule 136 includes a body 137 and a conductive portion 140. The body 137 preferably has a substantially cylindrical shape concentric with the glass tube 134. The inner diameter of the body 137 is preferably slightly larger than the outer diameter of the glass tube 134.

Three pairs of elastic gripping portions 138A, 138B are formed on the body 137 by making slit-shaped cuts in portions thereof, which are arranged at even angular intervals along the circumferential direction.

A first elastic gripping portion 138A, i.e., one of a pair of elastic gripping portions 138A, 138B, is generally formed as a cantilevered portion extending posteriorly (specifically, in an oblique direction slightly leaning radially inwardly), which is capable of elastic and radial deflection with a supported point on its proximal end (or anterior end). A curved portion 139 is formed on the distal end portion (or posterior end portion) of the first elastic gripping portion 138A, so as to curve in an oblique direction leaning radially outwardly. The outer surface of the curve (or inwardly facing surface) of the curved portion 139 is provided as a contact point when abutting on the outer circumferential surface of the glass tube 134. The imaginary line that connects the contact points provided on the three first elastic gripping portions 138A forms a circle concentric with the body 137. The diameter of the imaginary circle, when the first elastic gripping portions 138A are not forced into elastic deflection or are in a free state, is preferably smaller than the outer diameter of the glass tube 134.

A second elastic gripping portion 138B, i.e., the other of the pair of elastic gripping portions 138A, 138B, is arranged circumferentially adjacent to the first elastic gripping portion 138A, and is generally formed as a cantilevered portion extending anteriorly or reversely from the first elastic gripping portion 138A (specifically, in an oblique direction slightly leaning radially inwardly), which is capable of elastic and radial deflection with a supported point on its proximal end (or posterior end). The distal end of the second elastic gripping portion 138B is provided as a contact point when abutting on the outer circumferential surface of the glass tube 134. The imaginary line that connects the contact points provided on the three second elastic gripping portions 138B forms a circle concentric with the body 137. The diameter of the imaginary circle, when the second elastic gripping portions 138B are not forced into elastic deflection or are in a free state, is preferably smaller than the outer diameter of the glass tube 134.

On the body 137, a pair of protector portions are formed as cantilevered portions protruding anteriorly from the anterior end edge thereof. The pair of protector parts are arranged circumferentially spaced apart, and extend linearly from the body 137 so as to be flush therewith. The conductive portion 140 is provided as a cantilevered portion that extends anteriorly from between the pair of protector portions. The conductive portion 140 includes a long portion 141 continuous with the anterior end of the body 137, and a cylindrical portion 142 that further projects anteriorly from the anterior end (or distal end) of the long portion 141.

The long portion 141 includes a proximal portion 141a that extends from the body 137 so as to be flush with the body 137 and parallel or substantially parallel to the axis thereof, and further includes an intermediate portion 141b that extends radially inwardly from the distal end of the proximal portion 141a toward the axis of the body 137. Further included is a distal portion 141c that extends from the distal end of the intermediate portion 141b and parallel or substantially parallel to the axis of the body 137. The cylindrical portion 142 is connected to the distal end of the distal portion 141c. The width of the long portion 141 is set to be sufficiently small for the length of the long portion 141. Therefore, the long portion 141 is capable of elastic deformation in the radial direction of the body 137, elastic deformation in a direction intersecting with the radial direction (and intersecting with the longitudinal direction of the long portion 141), and elastic torsional deformation around the long portion 141 itself as the axis.

The cylindrical portion 142, which can be formed by bending a portion laterally extending from the distal end of the long portion 141 into a cylindrical shape, for example, is arranged substantially coaxially with the body 137. The cylindrical portion 142 is capable of displacement around the axis of the ferrule 136 and radial displacement, due to elastic deflection of the long portion 141.

Attachment of Ferrule 136 to Glass Tube 134

Next, an assembling process for attaching a ferrule 136 to a glass tube 134 will be explained.

During the assembling process, while a ferrule 136 and a glass tube 134 are held by respective holding devices (not shown), the ferrule 136 and the glass tube 134 are moved relatively and coaxially so as to approach each other. Thereby, the body 137 is fitted onto the glass tube 134. When the body 137 begins engagement, the contact points provided on the distal end portions of the three pairs of elastic gripping portions 138A, 138B have elastic contact with the outer circumference of the glass tube 134. The contact points slide on the outer circumferential surface of the glass tube 134, as the assembling process proceeds. Then, the tip of the outer lead 135 having passed through the body 137 begins to enter the hollow of the cylindrical portion 142. When both of the holding devices have thereafter reached predetermined final positions, the ferrule 136 and the glass tube 134 are axially positioned in proper positions, resulting in the tip end portion of the outer lead 135 circumferentially surrounded by the cylindrical portion 142. At the time, the tip end portion of the outer lead 135 will not greatly protrude from the anterior end of the cylindrical portion 142. That is, it slightly protrudes out of the cylindrical portion 142, or is aligned with the anterior end of the cylindrical portion 142, or alternatively it is located within the cylindrical portion 142.

Thereafter, the cylindrical portion 142 is clamped so as to deform with diameter reduction. After being clamped, the cylindrical portion 142 is electrically conductively fixed to the outer lead 135 by welding, for example, and consequently the ferrule 136 is integrated with the glass tube 134. Then, the assembling process terminates, and the discharge tube 115 is completed.

When the ferrule 136 is attached to the glass tube 134, the body 137 is concentrically held on the glass tube 134 due to the elastic holding function of the three pairs of elastic gripping portions 138A, 138B. A gap (airspace) is secured between the outer circumference of the glass tube 134 and the inner circumference of the body 137, so as to extend over the substantially entire circumference.

Figure 36:
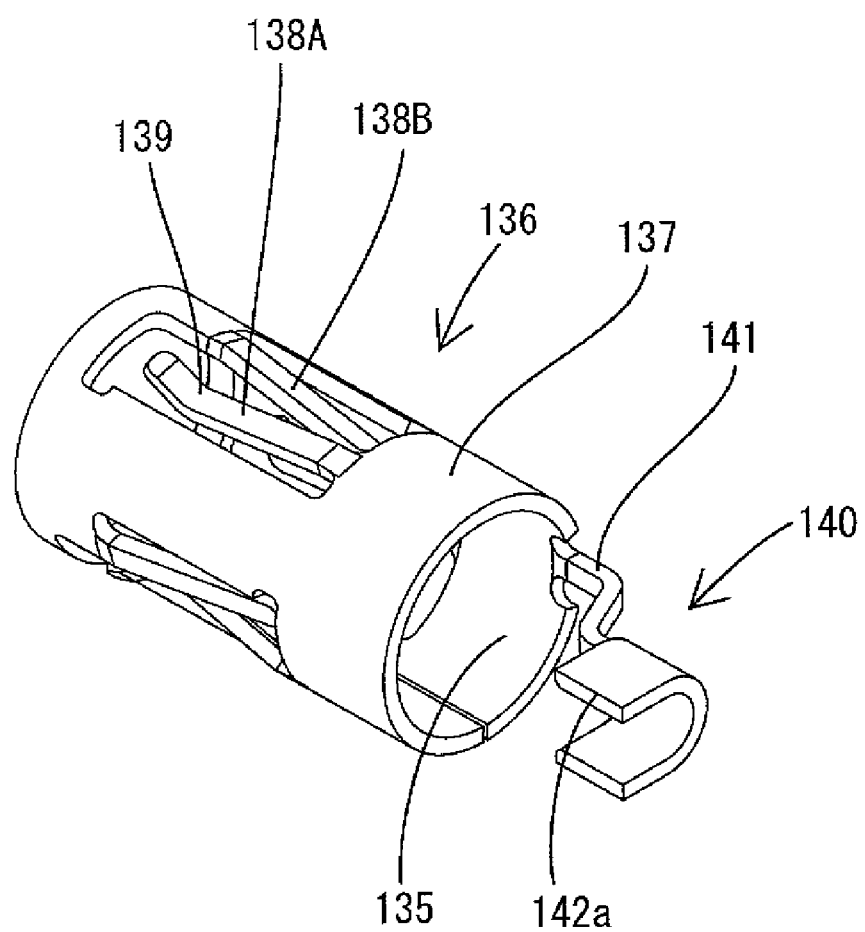
FIG. 36 is a perspective view showing a modification of a ferrule.
Figure 37:
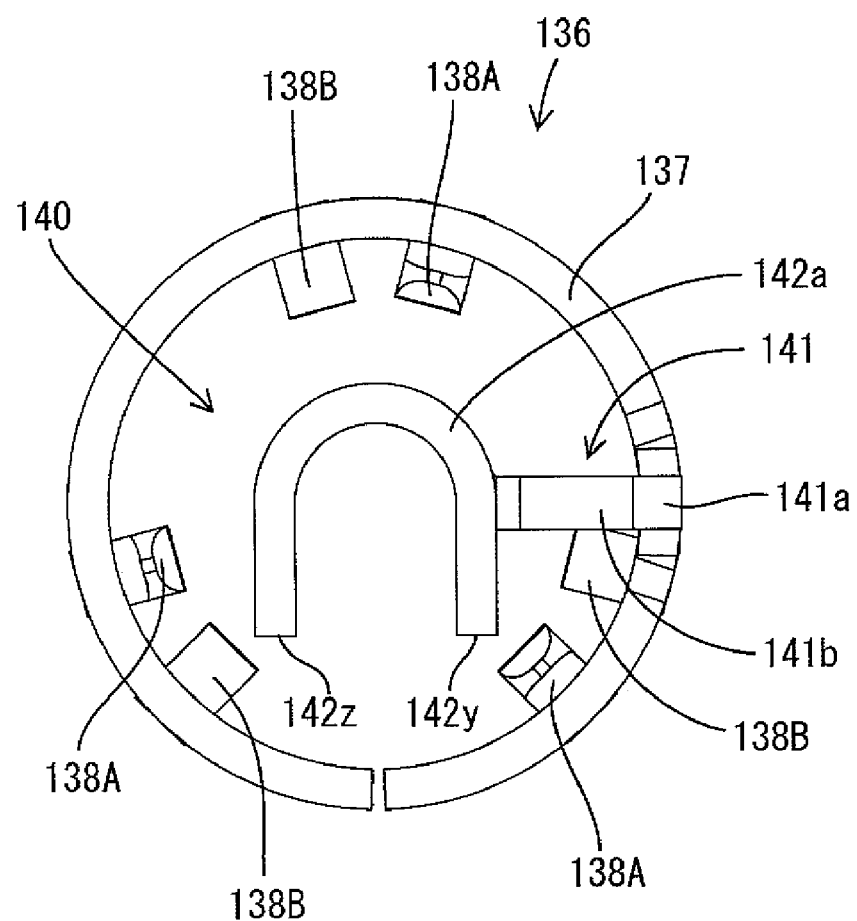
FIG. 37 is a side view of FIG. 36.

Instead of the cylindrical portion 142, a U-shaped connecting portion 142a may be provided as shown in FIGS. 36 and 37. In this case, after a glass tube 134 is fitted into a ferrule 136, the U-shaped connecting portion 142a is bended so as to hug the outer lead 135, in order to achieve electrical connection between the outer lead 135 and the connecting portion 142a. According to the present preferred embodiment thus including the bendable U-shaped connecting portion 142a, electrical connectivity with the outer lead 135 can be further improved.

Mounting of Discharge Tube 115 to Relay Connectors 114

The discharge tube 115, thus assembled, is fixed to relay connectors 114. At the time of fixation, the discharge tube 115 held in a horizontal position is moved toward the front surface of the chassis 113, and the end portions and the ferrules 136 of the glass tube 134 are fitted into the container rooms 123 of the relay connectors 114 from the front side. At the time, the pair of elastic pressing portions 132 are pushed by the body 137 of the ferrule 136 so as to open vertically due to elastic deflection. After the body 137 has passed through the shortest-distance portions of the pair of elastic pressing portions 132, the body 137 is pulled deep into the container room 123 due to elastic restoring forces of the elastic pressing portions 132, resulting in the body 137 abutting on the bottom of the container room 123. Then, the mounting of the discharge tube 115 is completed.

The discharge tube 115 thus mounted is held by the pairs of elastic pressing portions 132 at its end portions, and consequently is fixed to the chassis 113 via the relay terminals 131 and the holders 120 provided as the relay terminal 131 mounting bases. At the time, the weight of the discharge tube 115 is received solely by the chassis 113 via the relay connectors 114. That is, the outer leads 135 will not be under load due to the weight of the discharge tube 115.

The pair of elastic pressing portions 132 can have elastic contact with the outer circumferential surface of the body 137, and thereby the outer lead 135 is electrically conductively connected to the relay terminal 131 via the ferrule 136. Further, the glass tube 134 is held due to elastic restoring forces of the pair of elastic pressing portions 132, so as to be pressed against the concave portion 127 of the stopper 126. Therefore, when viewed along the axial direction of the discharge tube 115, the body 137 appears to be positioned so as to partially overlap with the stopper 126. That is, the end edge of the body 137 on the opposite side of the conductive portion 140 is axially positioned in proximity to the stopper 126 so as to be partially faced therewith.

The extended portion 129 is provided on the outer surface of the holder 120, which is perpendicular or substantially perpendicular to the surface of the chassis 113 and includes the escape opening 125 of the container room 123, so as to protrude from a location between the chassis 113 and the escape opening 125 and extend along the surface of the chassis 113. This results in a long creepage distance from the inside of the container room 123 to the front surface of the chassis 113. Thereby, a leak, from the discharge tube 115 held in the container room 123 to the chassis 113 outside the holder 120, can be prevented.

Overview of Power Board 116

Each power board 116 includes a circuit board 117 having a circuit provided on its back surface (i.e., the surface on the opposite side of the chassis 113), electronic components 119 mounted on the back surface of the circuit board 117, and a plurality of on-board connectors 118 mounted on the back surface of the circuit board 117.

The circuit board 117 preferably has a vertically-elongated rectangular shape as a whole, and is preferably formed using a phenolic paper-base copper-clad laminated board (known as a phenolic paper). A plurality of fitting holes 117H having a vertically-elongated rectangular shape are formed through the circuit board 117 so as to extend from the front side to the back side. The plurality of fitting holes 117H are arranged vertically along the lateral side edge of the circuit board 117 so as to correspond to the above-described relay terminals 131 (or relay connectors 114). Each on-board connector 118 includes a housing made of synthetic resin, and an output terminal (not shown) that is completely contained in the housing and made of metal (e.g., nickel silver). The on-board connectors 118 are arranged along the lateral side edge of the circuit board 117 so as to correspond to the respective fitting holes 117H. A fitting space (not shown) is formed on the outer surface of the housing so as to correspond to the fitting hole 117H, and the output terminal is partly exposed to the fitting space.

While the circuit board 117 is kept parallel or substantially parallel to the chassis 113, the power board 116 is moved toward the chassis 113 from the back side and is fixed thereto. At the time of fixation, the wall portions 122 of the relay connectors 114 and the board connecting portions 133 arranged along the wall portions 122 penetrate the circuit board 117 through the fitting holes 117H and are inserted into the fitting spaces of the on-board connectors 118. Thereby, the on-board connectors 118 are fitted onto the relay connectors 114, and the output terminals are conductively connected to the relay terminals 131.

Operational Effects of Preferred Embodiment 2

In preferred embodiment 2, when a discharge tube 115 is supported on relay connectors 114, the stoppers 126 lock the ferrules 136. Therefore, the discharge tube 115 is secure from axial movement relative to the relay connectors 114. That is, if a force is applied to the discharge tube 115 so as to cause movement to the right, the stopper 126 catches the left-adjacent ferrule 136 attached on the left end portion of the discharge tube 115 so that the movement of the discharge tube 115 to the right is restricted. If a force is applied to the discharge tube 115 so as to cause movement to the left, the stopper 126 catches the right-adjacent ferrule 136 attached on the right end portion of the discharge tube 115 so that the movement of the discharge tube 115 to the left is restricted. Thus, the axial movement of the discharge tube 115 to either right or left is restricted, and therefore the tip of the outer lead 135 is secure from hitting the wall of the container room 123 on the opposite side of the escape opening 125.

The stopper 126 can engage with and lock the end edge of the ferrule 136, and therefore a hole that can engage with the stopper 126 is not required to be formed on the outer circumference of the ferrule 136. Thereby, processing cost can be reduced, and reduction in strength of the ferrule 136 can be prevented.

In the case of a construction in which a stopper 126 can engage with the end edge of a ferrule 136 on the side of the conductive portion 140, the conductive portion 140 extending from the end edge of the ferrule 136 may preclude the end edge of the ferrule 136 from engaging with the stopper 126, when the ferrule 136 is attached at some angle about its axis. However, in preferred embodiment 2, the stopper 126 is arranged to engage with the end edge on the opposite side of the conductive portion 140. Therefore, the conductive portion 140 will not preclude the ferrule 136 from engaging with the stopper 126, and consequently the ferrule 136 can infallibly engage with the stopper 126.

The conductive portion 140 includes a cylindrical portion 142, which can be circumferentially connected to the outer lead 135 so as to surround it. Thereby, the conductive portion 140 can be prevented from disengaging from the outer lead 135. That is, the cylindrical portion 142 will not disengage from the outer lead 135 when the cylindrical portion 142 is clamped. Therefore, the conductive portion 140 can be infallibly connected to the outer lead 135.

The margin for engagement of a ferrule 136 with a stopper 126 corresponds to half of the dimensional difference between the outer diameters of the glass tube 134 and the ferrule 136. In preferred embodiment 2, ferrules 136 are concentrically held on a glass tube 134 due to the elastic gripping portions 138A, 138B. Therefore, if the ferrule 136 is set to be large, a large dimensional difference can be secured between the inner diameter thereof and the outer diameter of the glass tube 134. Thereby, the margin for engagement of the ferrule 136 with the stopper 126 can be increased, resulting in reliable restriction of movement of the discharge tube 115.

The concave portion 127 is formed on a stopper 126, so as to abut on the outer circumference of a glass tube 134 when the ferrule 136 engages with the stopper 126. Further, the pair of elastic pressing portions 132 capable of pressing the discharge tube 115 toward the concave portion 127 side are provided in the relay connector 114. Specifically, the pair of elastic pressing portions 132 press the discharge tube 115 toward the concave portion 127 side, obliquely from above and obliquely from below, i.e., vertically symmetrically. Thereby, the glass tube 134 is prevented from disengaging from the concave portion 127, and therefore the engagement of the ferrule 136 with the stopper 126 can be reliably maintained.

The relay connector 114 is formed by mounting a relay terminal 131 in a holder 120 made of synthetic resin. In preferred embodiment 2, the stopper 126 is formed on the synthetic-resin holder 120. Therefore, a stopper is not required to be formed on the relay terminal 131, and thereby the material for manufacturing the relay terminals 131 can be reduced. Considering that the material cost for synthetic resin is generally lower than that for metal, the material cost for relay connectors 114 can be reduced according to preferred embodiment 2.

Preferred Embodiment 3

Next, preferred embodiment 3 of the present invention will be explained with reference to FIGS. 29 to 35. In preferred embodiment 3, the constructions of the structure to support a discharge tube 115 differ from those of preferred embodiment 2. The other constructions are similar to preferred embodiment 2. Therefore, the same constructions are designated by the same symbols, and explanations for the constructions, operations and effects thereof are omitted.

Overview of Grounding Member 150

In preferred embodiment 2, the end portions of a discharge tube 115 are supported by relay connectors 114, each of which includes a holder 120 and a relay terminal 131. In preferred embodiment 3, one of the end portions of a discharge tube 115 is supported by the same relay connector 114 as in preferred embodiment 2, while the other end portion of the discharge tube 115 is supported by a grounding member 150.

The grounding member 150 includes an elongated support plate 151 fixed to the chassis 113 so as to extend along one of the lateral edge portions thereof, and further includes a plurality of grounding terminals 152 conductively mounted on the front surface of the support plate 151. Mounting holes 151H are formed through the support plate 151 so as to correspond three-to-one with the grounding terminals 152. The support plate 151 is formed of a substrate or a metallic plate.

On the other hand, each grounding terminal 152, which can be formed by bending a metallic (e.g., nickel silver) plate that is formed into a predetermined shape by punching, for example, includes a base portion 153 and a pair of elastic pressing portions 154 which extend vertically symmetrically from the respective upper and lower edge portions of the base portion 153 to the front side. Further included is a stopper 155 that extends from one of the lateral edge portions of the base portion 153 to the front side.

The pair of elastic pressing portions 154 are provided on the lateral edge portion on the opposite side of the stopper 155, so as to form bulging curves toward each other. The elastic pressing portions 154 are capable of elastic deflection so as to increase the distance therebetween. The minimum distance between the pair of elastic pressing portions 154, when the elastic pressing portions 154 are free from elastic deflection, is preferably smaller than the outer diameter of the glass tube 134 of a discharge tube 115.

The stopper 155 is raised from the base portion 153, so as to form a right angle with the axis of the discharge tube 115. A concave portion 156 is formed on the stopper 155, so as to sag in a substantially circular arc. On a relay connector 114 of preferred embodiment 2, a pair of guiding portions 128 are raised from the respective upper and lower sides of the concave portion 127 of the stopper 126. However, in preferred embodiment 3, the heights of portions raised from the respective upper and lower sides of the concave portion 156 of the base portion 153 are reduced to be short. That is, elements corresponding the guiding portions 128 of the embodiment 2 are not provided. Therefore, metallic material required for grounding terminals 152 can be reduced, compared to including guiding portions.

Three leg portions 157 are further formed on the base portion 153, so as to be integrated therewith. Two of the three leg portions 157 are provided between the elastic pressing portions 154 and the stopper 155, so as to project from the respective upper and lower edge portions of the base portion 153 to the opposite side of the elastic pressing portions 154 or the stopper 155 (i.e., to the back side). The remaining one of the leg portions 157 is provided on the lateral edge of the base portion 153 on the opposite side of the stopper 155, so as to project from the intermediate position between the elastic pressing portions 154 to the opposite side of the elastic pressing portions 154 or the stopper 155 (i.e., to the back side).

The grounding terminal 152 is not housed in a member such as a plastic housing, i.e., barely provided, and is conductively fixed to the support plate 151 by soldering or the like so that its leg portions 157 penetrate through the mounting holes 151H. Thus, the plurality of grounding terminals 152 are mounted to the common support plate 151, and thereby are conductively connected to one another via the support plate 151. Power boards are not connected to the grounding members 150, and the support plate 151 is conductively connected to the chassis.

Mounting of Discharge Tube 115 to Grounding Terminal 152

When a discharge tube 115 is fixed to a grounding terminal 152, the discharge tube 115 held in a horizontal position is moved toward the front surface of the chassis 113, and the end portion and the ferrule 136 of the glass tube 134 are fitted between the pair of upper and lower elastic pressing portions 154 from the front side. At the time, the pair of elastic pressing portions 154 are pushed by the body 137 of the ferrule 136 so as to open vertically due to elastic deflection. After the body 137 has passed through the shortest-distance portions of the pair of elastic pressing portions 154, the body 137 is pulled toward the base portion 153 side due to elastic restoring forces of the elastic pressing portions 154, resulting in the body 137 abutting on the base portion 153. Then, the fixation of the discharge tube 115 is completed. The other end portion of the discharge tube 115 is fixed to a relay connector 114 in a similar manner to preferred embodiment 2.

The discharge tube 115 thus mounted is supported by the relay connector 114 and the grounding member 150 at its respective end portions. The pairs of elastic pressing portions 132, 154 can have elastic contact with the outer circumferential surfaces of the bodies 137 of the ferrules 136, and thereby the outer leads 135 are electrically conductively connected to the relay terminal 131 and the grounding terminal 152 via the ferrules 136. Further, the glass tube 134 is held due to elastic restoring forces of the pairs of elastic pressing portions 132, 154, so as to be pressed against the concave portions 127, 156 of the stoppers 126, 155. Therefore, when viewed along the axial direction of the discharge tube 115, the body 137 appears to be positioned so as to partially overlap with the stopper 126 or 155. That is, the end edge of the body 137 on the opposite side of the conductive portion 140 is axially positioned in proximity to the stopper 126 or 155 so as to be partially faced therewith.

Figure 38:
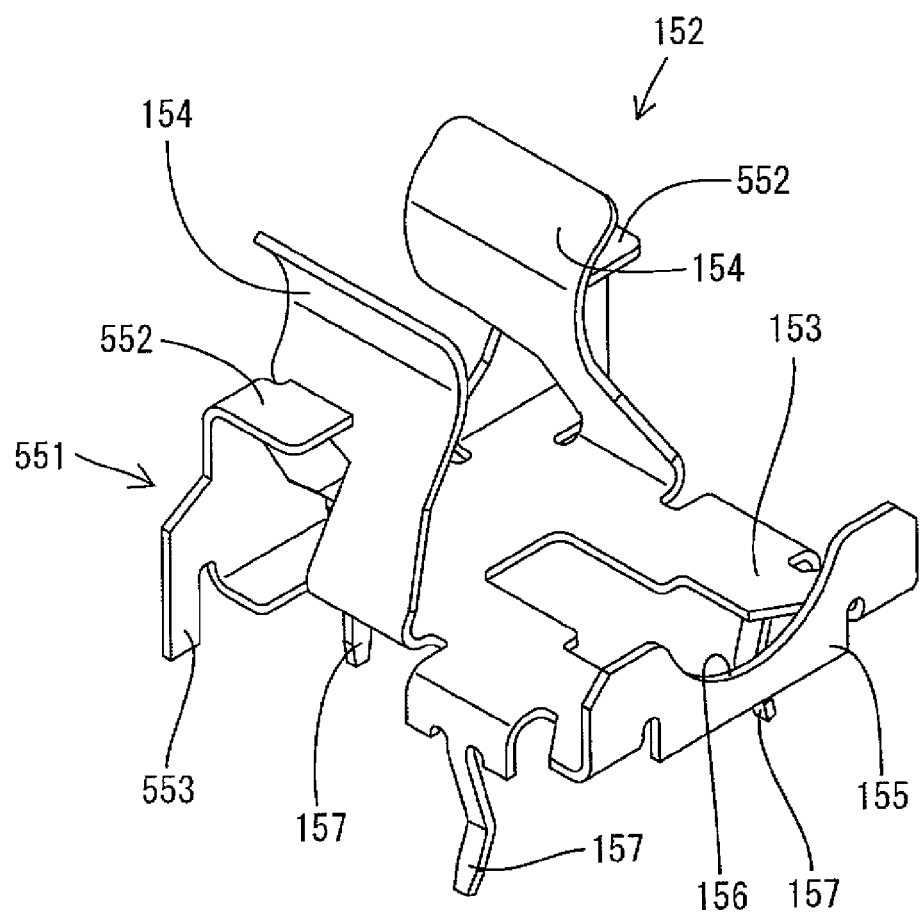
FIG. 38 is a perspective view of a grounding terminal.
Figure 39:
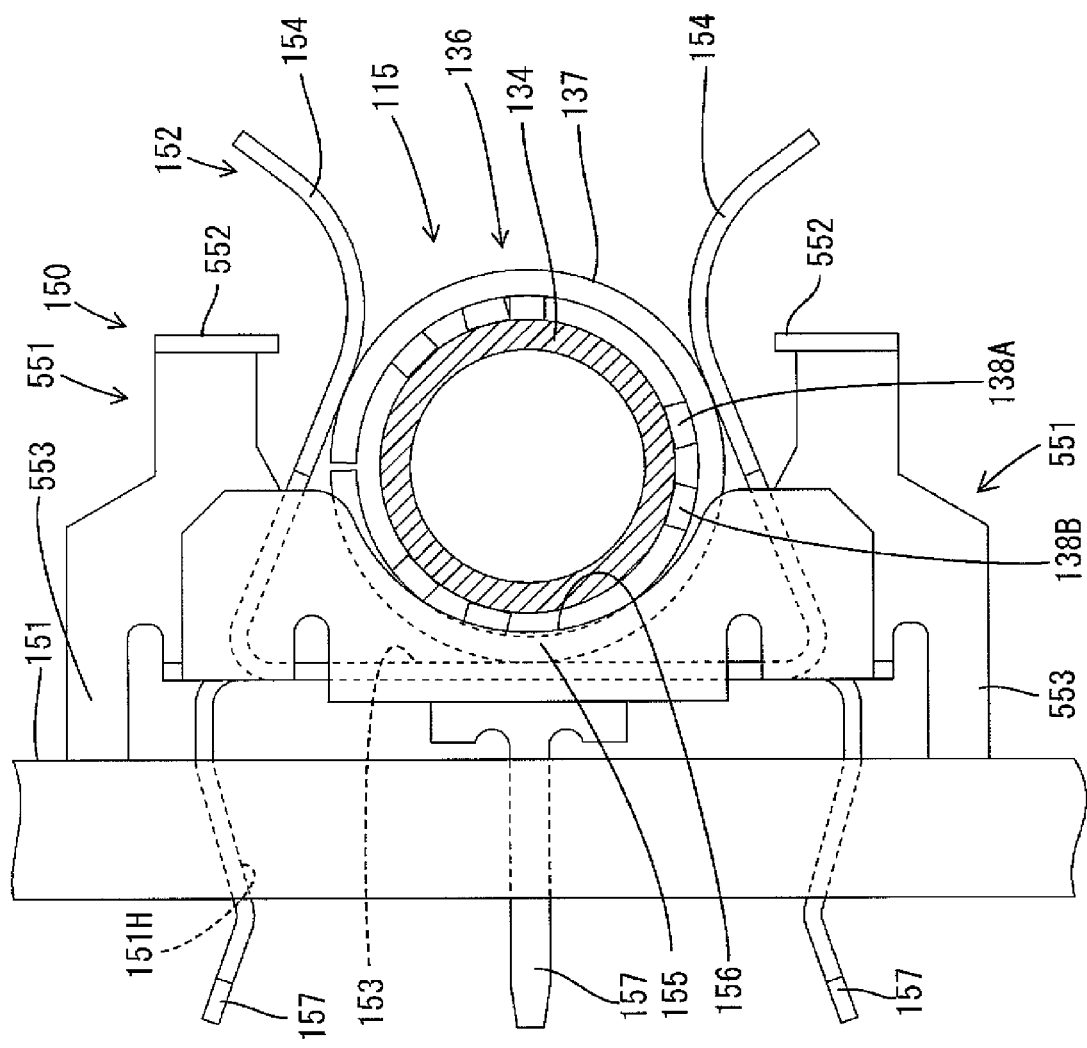
FIG. 39 is a sectional view showing a connection between a grounding terminal shown in FIG. 38 and a ferrule.

As shown in FIGS. 38 and 39, protector portions 551 may be provided on the grounding terminal 152. Each protector portion 551 includes a restricting portion 552 for an elastic pressing portion, and further includes an abutting portion 553 for abutting on the support plate. When the grounding terminal 152 is mounted and fixed to the support plate 151, the abutting portions 553 abut on or are located close to the support plate 151. If some kind of external force is applied to the elastic pressing portions 154 so that they are pushed to open, they first become in contact with the restricting portions 552 during the course of opening. The abutting portions 553 serve as supports for preventing the protector portions 551 from collapsing, when an additional load is thereafter applied. The protector portions 551 are connected to the feet of the elastic pressing portions 154, and therefore the abutting portions 553 should be formed lateral to the connection portion in order that the abutting portions 553 work. Note that abutting portions 553 located at a longer distance from the connection portion are more effective.

Operational Effects of Preferred Embodiment 3

In preferred embodiment 3, when a discharge tube 115 is supported on a relay connector 114 and a grounding member 150, the stopper 126 of the holder 120 and the stopper 155 of the grounding terminal 152 lock the ferrules 136 on the respective ends of the discharge tube 115. Therefore, the discharge tube 115 is secure from axial movement relative to the relay connector 114.

That is, if a force is applied to the discharge tube 115 so as to cause movement from the relay connector 114 side to the grounding member 150 side, the ferrule 136 attached on the end portion of the discharge tube 115 on the relay connector 114 side is caught by the stopper 126 of the holder 120 so that the movement of the discharge tube 115 to the grounding member 150 side is restricted. If a force is applied to the discharge tube 115 so as to cause movement from the grounding member 150 side to the relay connector 114 side, the ferrule 136 attached on the end portion of the discharge tube 115 on the grounding member 150 side is caught by the stopper 155 of the grounding terminal 152 so that the movement of the discharge tube 115 to the relay connector 114 side is restricted. Thus, the axial movement of the discharge tube 115 to either right or left is restricted, and therefore the tip of the outer lead 135 is secure from hitting the wall of the container room 123 on the opposite side of the escape opening 125 or hitting the sidewall of the chassis 113.

The concave portion 156 is formed on the stopper 155 of a grounding terminal 152, so as to abut on the outer circumference of a glass tube 134 when the ferrule 136 is engaged with the stopper 155. Further, the pair of elastic pressing portions 154 capable of pressing the discharge tube 115 toward the concave portion 156 side are provided on the grounding terminal 152. Specifically, the pair of elastic pressing portions 154 press the discharge tube 115 toward the concave portion 156 side, obliquely from above and obliquely from below, i.e., vertically symmetrically. Thereby, the glass tube 134 is prevented from disengaging from the concave portion 156, and therefore the engagement of the ferrule 136 with the stopper 155 can be reliably maintained.

On the grounding member 150, the stoppers 155 are integrated with the respective grounding terminals 152 to provide conductive connection to the ferrules 136. Thereby, the number of components can be reduced in preferred embodiment 3, compared to including stoppers provided as separate members from the grounding terminals.

Other Preferred Embodiments

The present invention is not limited to the preferred embodiments explained in the above description made with reference to the drawings. The following preferred embodiments may be included in the technical scope of the present invention, for example.

The insulating portion of the housing is not limited to having a substantially block-shaped configuration provided continuously along the substantially entire width of the housing, but rather may be formed of a plurality of protrusions spaced apart along the width direction of the housing.

Instead of the insulating portion functioning as a positioning mechanism to position the housing on the circuit board, a portion other than the insulating portion may be used for positioning the housing on the circuit board.

The output terminal is not limited to having an elongated shape arranged substantially perpendicularly to the edge portion of the circuit board, but rather may have a plate-shaped configuration arranged parallel or substantially parallel to the edge portion of the circuit board.

The output terminal is not limited to being positioned, in the width direction parallel or substantially parallel to the edge portion of the circuit board, so as to be substantially at the center of the housing. The output terminal may be arranged at an off-center position displaced to one side along the width direction.

The output terminal, which is arranged in the limited area of the housing farther from the edge portion of the circuit board, may be formed so as to partially project to the outside of the housing.

The connecting portion of the output terminal may be arranged so as to be exposed to the outside through an outer surface of the housing other than the circuit board facing surface of the housing, instead of being exposed to the outside through the circuit board facing surface.

The connecting portion of the output terminal, provided for connection to the outside, may be arranged along the outer surface of the housing, instead of being arranged in the engaging recess.

The engaging recess may have an opening on an outer surface of the housing other than the circuit board facing surface, instead of the opening on the circuit board facing surface.

The insulating portion of the housing, not involved in arrangement of the output terminal, may have the same thickness measured from the circuit board, as the terminal holding portion provided for arrangement of the output terminal.

The insulating portion of the housing, not involved in arrangement of the output terminal, may differ in width from the terminal holding portion provided for arrangement of the output terminal.

On the housing, the edge portion of the terminal holding portion on the insulating portion side may be formed into a square corner, instead of being cut into a tapered shape.

The output terminal may be formed into a predetermined shape simply by punching a metallic material, without bending.

The display panel of the display device is not limited to having TFTs as switching elements, but rather may include, as switching elements, elements other than TFTs such as MIM (Metal Insulator Metal) elements.

The display device is not limited to a liquid crystal display device. Various display devices requiring a lighting device on the back side of a display panel can be included.

The material for housings is not limited to synthetic resin. An insulating material other than synthetic resin can be used, instead.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A power board comprising:
  a circuit board; and
  an on-board connector provided on said circuit board; wherein
  said on-board connector is arranged in a vicinity of an edge portion of said circuit board;
  said on-board connector includes an output terminal, and a housing that is made of an insulating material and includes a portion that is arranged to surround at least one portion of said output terminal;
  said output terminal has an elongated shape extending in a direction substantially perpendicularly to the edge portion of said circuit board, and is positioned in a width direction substantially parallel to the edge portion of said circuit board, so as to be substantially at a center of said housing and arranged in an area of said housing spaced away from the edge portion of said circuit board such that said output terminal is provided within an enclosed chamber defined between the circuit board and the housing;
  said housing includes a terminal holding portion, an engaging recess, and a portion that does not surround the at least one portion of said output terminal;
  said portion that does not surround the at least one portion of said output terminal, which is closer to the edge portion of said circuit board, defines an insulating block portion and a reinforcing portion;
  said insulating block portion has a substantially block-shaped configuration provided continuously along substantially an entire width of said housing;
  said reinforcing portion is arranged to fix said housing to said circuit board;
  said terminal holding portion has a larger thickness than said portion that does not surround the at least one portion of said output terminal as measured from said circuit board so that a step-shaped portion is provided therebetween; and
  said engaging recess is defined in said housing so as to include an opening on a circuit board side, and a connecting portion of said output terminal, provided for connection to an outside element, is arranged in said engaging recess.

2. A power board according to claim 1, wherein an edge portion of said terminal holding portion on a side of the portion that does not surround the at least one portion of said output terminal has a tapered shape.

3. An on-board connector to be mounted to a circuit board in order to provide a power board so as be arranged in a vicinity of an edge portion of said circuit board, said on-board connector comprising:
  an output terminal; and
  a housing that is made of an insulating material and includes a portion that is arranged to surround at least one portion of said output terminal; wherein
  said output terminal has an elongated shape arranged substantially perpendicularly to the edge portion of said circuit board, and is positioned in a width direction such that it is substantially parallel to the edge portion of said circuit board, so as to be substantially at a center of said housing to be arranged in an area of said housing, which corresponds to an area of said circuit board spaced away from the edge portion of said circuit board such that said output terminal is to be provided within an enclosed chamber to be defined between the circuit board and the housing;
  said housing includes, a terminal holding portion, an engaging recess, and a portion that does not surround the at least one portion of said output terminal;
  said portion that does not surround the at least one portion of said output terminal, which is capable of being arranged closer to the edge portion of said circuit board, defines an insulating block portion and a reinforcing portion;
  said insulating block portion has a substantially block-shaped configuration provided continuously along substantially an entire width of said housing;
  said reinforcing portion is arranged to fix said housing to said circuit board;
  said terminal holding portion has a larger thickness than said portion that does not surround the at least one portion of said output terminal as measured from said circuit board so that a step-shaped portion is provided therebetween; and
  said engaging recess is defined in said housing so as to include an opening provided on a surface thereof to be mounted to the circuit board, and a connecting portion of said output terminal, arranged to provide a connection to an outside element, is arranged in said engaging recess.

4. An on-board connector according to claim 3, wherein an edge portion of said terminal holding portion on a side of the portion that does not surround the at least one portion of said output terminal has a tapered shape.

* * * * *